(12) United States Patent
Edwards et al.

(10) Patent No.: US 7,692,217 B2
(45) Date of Patent: Apr. 6, 2010

(54) MATCHED ANALOG CMOS TRANSISTORS WITH EXTENSION WELLS

(75) Inventors: Henry Litzmann Edwards, Garland, TX (US); Hisashi Shichijo, Plano, TX (US); Tathagata Chatterjee, Allen, TX (US); Shyh-Horng Yang, Hsinchu (TW); Lance Stanford Robertson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/948,172

(22) Filed: Nov. 30, 2007

(65) Prior Publication Data

US 2009/0140346 A1    Jun. 4, 2009

(51) Int. Cl.
    *H01L 27/148*    (2006.01)
(52) U.S. Cl. ............... 257/240; 257/286; 257/E21.427; 257/E29.049
(58) Field of Classification Search ................ 257/204, 257/206, 239, 286, 500, 240, E21.427, E29.049; 438/163
    See application file for complete search history.

(56) References Cited

U.S. PATENT DOCUMENTS 6,613,615 B2 * 9/2003 Mandelman et al. ........ 438/154
2007/0278613 A1 * 12/2007 Imade ........................ 257/500

* cited by examiner

*Primary Examiner*—Quoc D Hoang
(74) *Attorney, Agent, or Firm*—Warren L. Franz; Wade J. Brady, III; Frederick J. Telecky, Jr.

(57) ABSTRACT

One embodiment of the invention relates to an integrated circuit. The integrated circuit includes a first matched transistor comprising: a first source region, a first drain region formed within a first drain well extension, and a first gate electrode having lateral edges about which the first source region and first drain region are laterally disposed. The integrated circuit also includes a second matched transistor comprising: a second source region, a second drain region formed within a second drain well extension, and a second gate electrode having lateral edges about which the second source region and second drain region are laterally disposed. Analog circuitry is associated with the first and second matched transistors, which analog circuitry utilizes a matching characteristic of the first and second matched transistors to facilitate analog functionality. Other devices, methods, and systems are also disclosed.

19 Claims, 27 Drawing Sheets

MATCHED ANALOG CMOS TRANSISTORS WITH EXTENSION WELLS

FIELD OF INVENTION

The present invention relates generally to semiconductor devices and more particularly to methods and systems for providing matched transistors.

BACKGROUND OF THE INVENTION

Since semiconductor transistors were first implemented, there has been an ongoing effort to reduce the area that individual transistors take up on an integrated circuit (i.e., "shrink" them), thereby allowing more transistors to fit on the integrated circuit. This trend is one factor that helps manufacturers to produce more powerful integrated circuits that have more functionality than previous generations. Indeed, this is one factor that has helped to usher in the communication age as we know it.

In addition to shrinking the area of individual transistors, in many applications designers also go to great lengths to match the characteristics of various transistors on a single integrated circuit, particularly for transistors used in analog circuits. For example, designers often match transistors' geometries (i.e., layouts) so that the transistors experience similar electrical stresses with respect to surrounding devices. Thus, these geometrically matched transistors will often have the same widths and lengths, and will often be structured so that their interconnect layers have similar layouts. Depending on design constraints, designers may want to match the gains ($\beta$), currents delivered ($I_{DS}$), voltage thresholds ($V_T$), or other transistor characteristics of two or more transistors.

Accordingly, there is an ongoing need for integrated circuits that strike a balance between minimal transistor area and precise matching.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the invention relates to an integrated circuit. The integrated circuit includes a first matched transistor comprising: a first source region, a first drain region formed within a first drain well extension, and a first gate electrode having lateral edges about which the first source region and first drain region are laterally disposed. The integrated circuit also includes a second matched transistor comprising: a second source region, a second drain region formed within a second drain well extension, and a second gate electrode having lateral edges about which the second source region and second drain region are laterally disposed. Analog circuitry is associated with the first and second matched transistors, which analog circuitry utilizes a matching characteristic of the first and second matched transistors to facilitate analog functionality.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
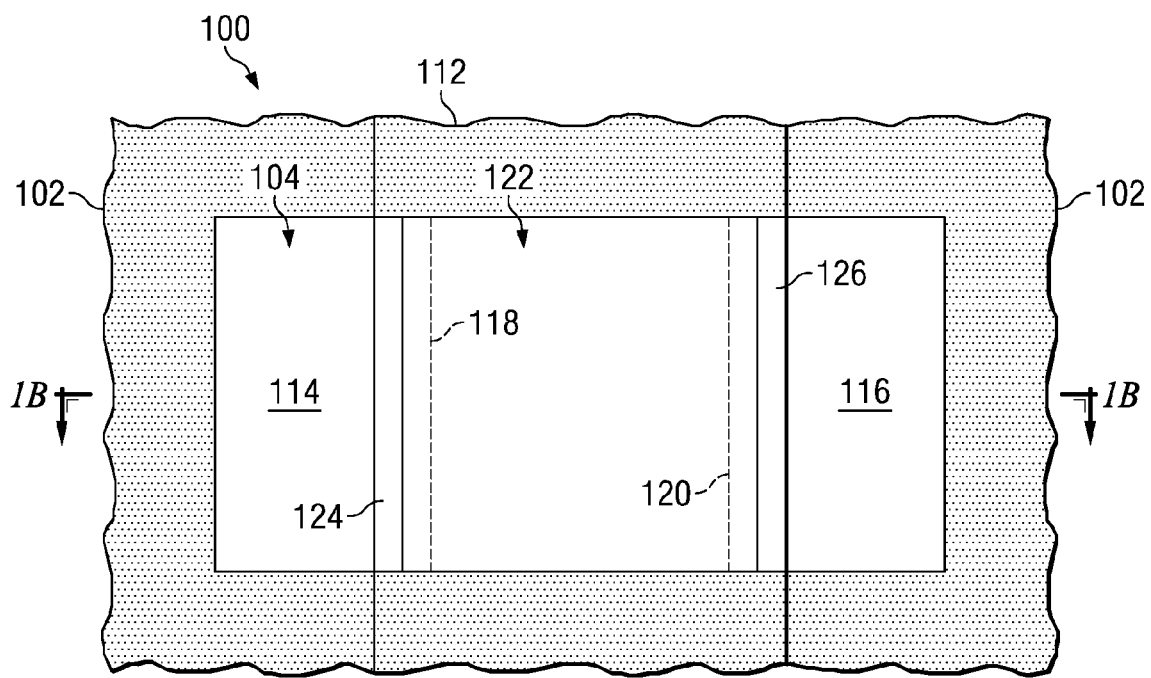
FIGS. 1A-1B show a somewhat conventional transistor.

The present invention will now be described with reference to the attached drawing figures, wherein like reference numerals are used to refer to like elements throughout, and wherein the illustrated structures and devices are not necessarily drawn to scale. For purposes of clarity, the figures in this disclosure show junctions between p-type and n-type material as solid lines. For example, in FIG. 1B's illustrated PMOS device there is a p-n junction between source 114 and well 106. By comparison, when the same type of doping is used but at different concentrations to establish different regions, dashed lines are used. For example, in FIG. 1B's PMOS device, pocket implant region 118 has the same doping type as well 106.

Figure 1B:
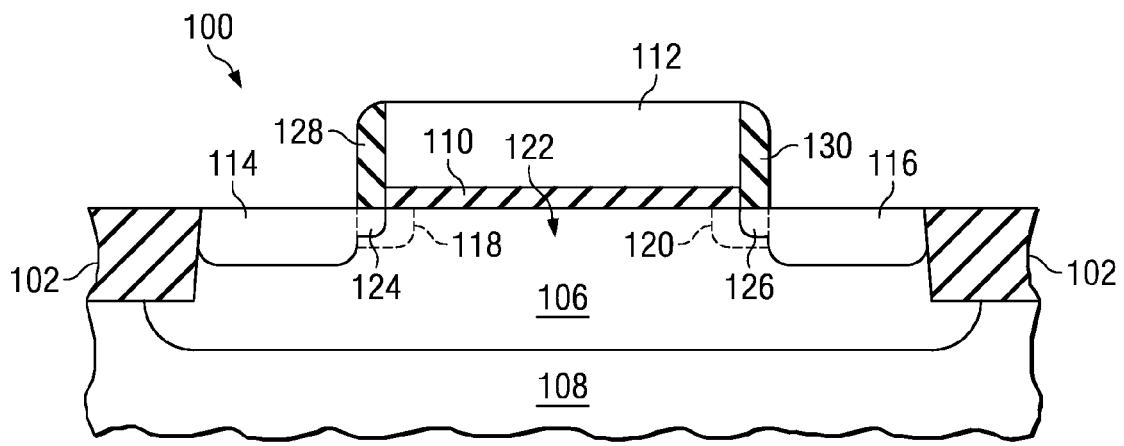

Referring now to FIGS. 1A-1B, one can see a somewhat traditional metal-oxide semiconductor field effect transistor 100 (MOSFET) that is formed in a semiconductor body. An isolation trench 102, which typically comprises oxide or another dielectric, surrounds a rectangular isolated region 104 within the semiconductor body. In the illustrated embodiment, the isolated region 104 may correspond to a lightly doped well 106, which is formed over a substrate 108. Often, one can think of the isolation trench 102 as a "sea" surrounding islands of silicon where devices are built.

A dielectric layer 110 can directly overlie the well 106 or substrate 108 and provides electrical isolation between a gate electrode 112 and a channel region in which charged carriers flow between a source 114 and drain 116. Pocket implant regions 118, 120, which are separated from one another by a bulk region 122, can be formed under the lateral edges of the gate-electrode. Source/drain extension regions 124, 126 and spacers 128, 130 can also be formed.

Typically, the source and drain 114, 116 and source/drain extension regions 124, 126 have a first conductivity type, while the bulk region 122 and pocket implant regions 118, 120 have a second conductivity type that is opposite to the first conductivity type. For example, in the illustrated embodiment, the source and drain 114, 116 could be p-type (highly doped P++), while the bulk region 122 and pocket implant regions 118, 120 could be n-type (lightly doped N−, and highly doped N+, respectively). In such a configuration (i.e., a PMOS device), the substrate 108 could be lightly doped p-type material (P−).

During operation, current selectively flows between the source and drain 114, 116 through the pocket implant regions 118, 120 and the bulk region 122, depending on the bias applied to the device. Thus, the region between source and drain in which charged carriers flow (i.e., current flows) may be referred to as the channel region.

The inventors have appreciated that the bulk region 122 and pocket implant regions 118, 120 can be thought of as three discrete devices that are connected in series. Therefore, if all charge flows exclusively between source 114 and drain 116 and none leaks through the substrate 108 or gate dielectric 110, no one of these devices should carry more current than another of them (i.e., all three of these discrete devices should carry approximately the same current). Because the pocket implant regions 118, 120 have a high magnitude potential barrier relative to that of the bulk region 122, under these assumptions, the pocket implant regions 118, 120 often act as "blockades" to regulate the amount of current that actually flows through the device.

Because the concentration of dopant atoms in the pocket implant regions 118, 120 is difficult to precisely control (e.g., due to statistical variations in the small number of atoms that make up the pocket regions), the potential barriers associated with the pocket implant regions can vary widely from one transistor to another. Because the pocket implant regions often regulate the current of the device, variation in the pocket implant regions is bad for matching one transistor to another, particularly at low overdrive ($V_{GS}$-$V_T$) values used to save headroom in analog circuits.

The inventors have also appreciated that the pocket regions 118, 120 cause poor (low) output resistance due to depletion of the pocket regions with drain voltage. Therefore, some aspects of the invention relate to a device that includes a source and/or drain extension well that effectively removes one or more of the pocket regions, thereby improving both the output resistance of the device and the ability to match one such device to another. Some illustrative embodiments are now set forth below.

Figure 2:
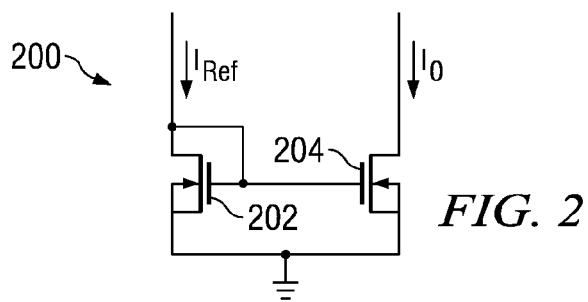
FIG. 2 shows a schematic of an integrated circuit having first and second matched transistors.

Referring now to FIG. 2, one can see an example of an integrated circuit 200 that includes first and second matched transistors 202, 204 (e.g., metal-oxide-semiconductor field effect transistors (MOSFETs)), which have identical length-to-width ratios. The matched transistors 202, 204 are associated with analog circuitry that utilizes a matching characteristic of the first and second matched transistors to facilitate analog functionality. For example, in the illustrated embodiment, the first and second matched transistors 202, 204 comprise a current mirror where the first and second matched transistors 202, 204 provide matched currents $I_{Ref}$, $I_O$ along two legs of the current mirror. Thus, because a common gate voltage is applied to the gate electrodes of the matched transistors 202, 204 and a common drain-source voltage ($V_{DS}$) is also established, the transistors could provide matched currents $I_{Ref}$, $I_O$ between their sources and drains ($I_{DS}$). In other embodiments, the matched transistors could provide matched gains (β), voltage thresholds ($V_T$), etc. For example, other matched transistors could be used in amplifiers, or any number of other types of analog circuits. In further embodiments disclosed herein, one can see several examples of devices that could be employed for the first and second matched transistors. Notably, to improve matching, these devices include extension wells, which are formed around at least one source/drain region.

Figure 3A:
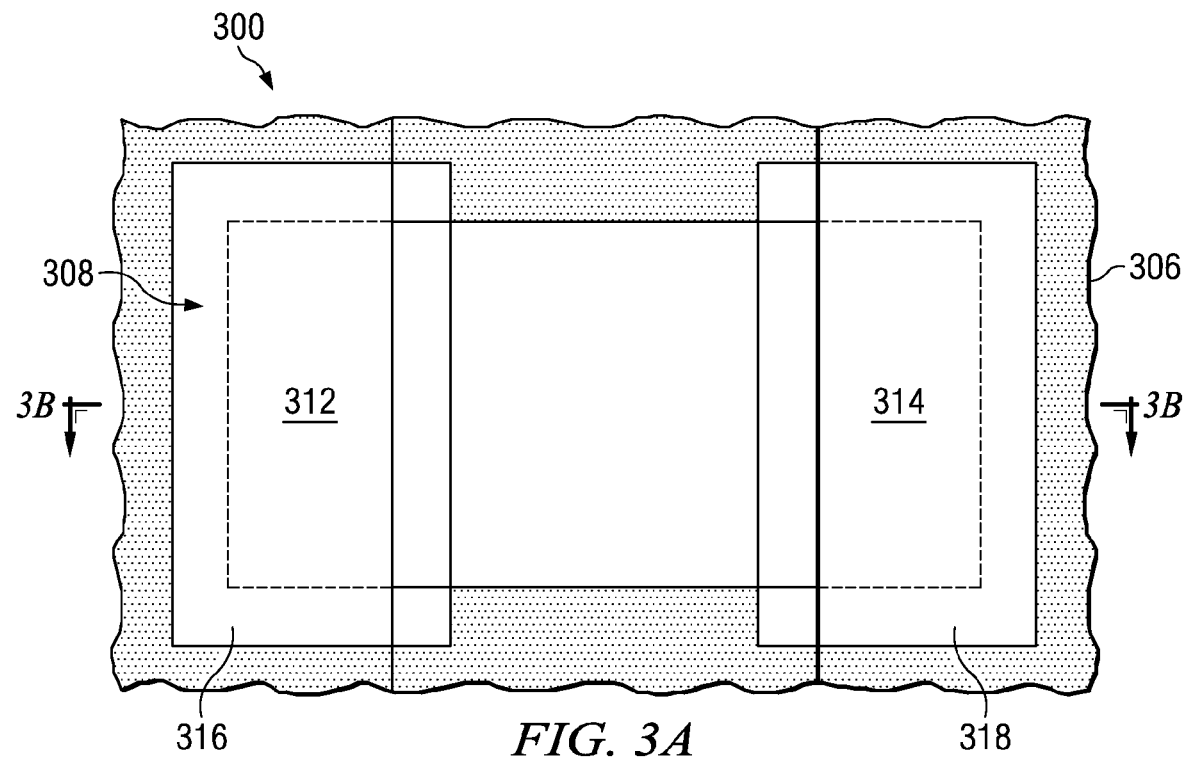
FIGS. 3A-3B show a top (layout) view and cross-sectional view of an illustrative first or second matched transistor in accordance with aspects of the present invention.
Figure 3B:
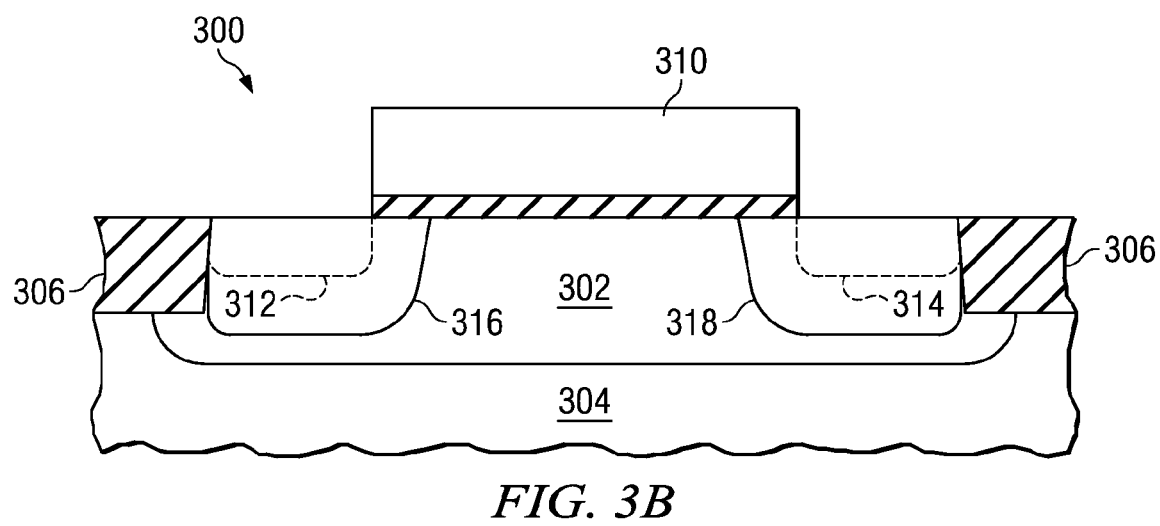

FIGS. 3A-3B show an example of a device that may correspond to the first or second matched transistor. The device is a symmetric drain-extended device 300 formed over a lightly doped well 302 of a semiconductor substrate 304. In addition to an isolation trench 306 that surrounds an isolated region 308, the device 300 includes a gate electrode 310 about which source and drain regions, 312, 314 are laterally disposed. The source 312 is formed within a source extension well 316 and the drain 314 is formed within a drain extension well 318. These extension wells 316, 318 allow for the removal of the pocket implant regions previously discussed.

By removing the pocket implant regions, which are a source of mismatch between otherwise geometrically matched transistors, the extension wells 316, 318 improve matching. Depending on the preciseness of matching that is desired, a designer can choose to include both source and drain extension wells 316, 318 (more precise matching), or only one of a source extension well 316 or a drain extension well 318 (less precise matching) where all such embodiments are contemplated as falling within the scope of the present invention.

In addition to providing devices with source and/or drain-extension wells to improve matching (e.g., device 300), the inventors have appreciated that refinements can be made to further shrink these devices. More specifically, by analyzing the relative contributions of the bulk region 122 and pocket regions 118, 120 to matching between two conventional devices, the inventors have appreciated that the majority of the area in the bulk region 122 may be wasted in terms of the ability to match one device to another. Therefore, aspects of the invention relate to scaling the bulk region 122 to smaller sizes to save area without affecting the ability of a designer to match one device to another device. For example, to provide a transistor with a smaller area without sacrificing matching, devices that employ "I-shaped" or "T-shaped" bulk regions could be used instead of more typical rectangular-shaped bulk regions. These I-shaped or T-shaped bulk regions could be achieved by forming correspondingly shaped isolation structures or by corresponding doping variations under the gate electrode. Although I-shaped and T-shaped bulk regions are discussed below, it will be appreciated that these are only examples and that other non-rectangular shaped bulk regions also fall within the scope of the invention.

In addition to the matching improvement, the output resistance of the transistor will be improved, due to the effect of the pocket implant on the drain-induced barrier lowering. Higher output resistance improves various analog circuit care-abouts such as transistor voltage gain, common mode rejection ratio, and power supply rejection ratio.

Figure 4A:
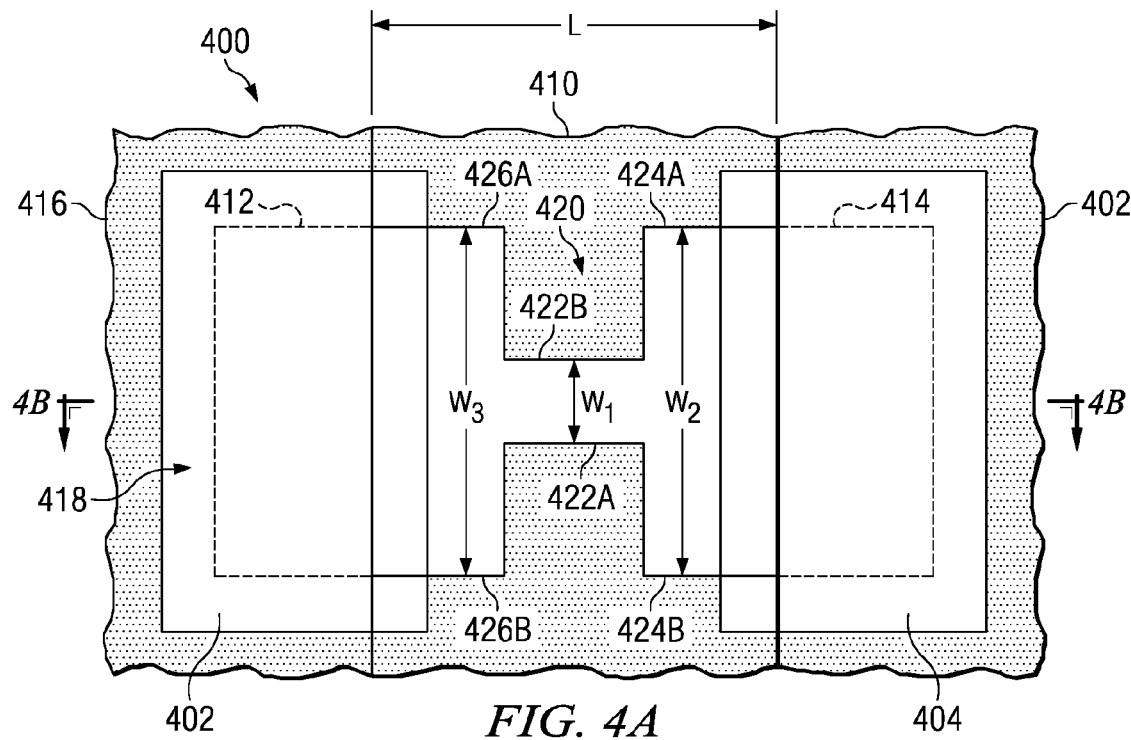
FIGS. 4A-4B show a top view and cross-sectional view of an illustrative first or second matched transistor having various widths under its gate electrode in accordance with aspects of the present invention.
Figure 4B:
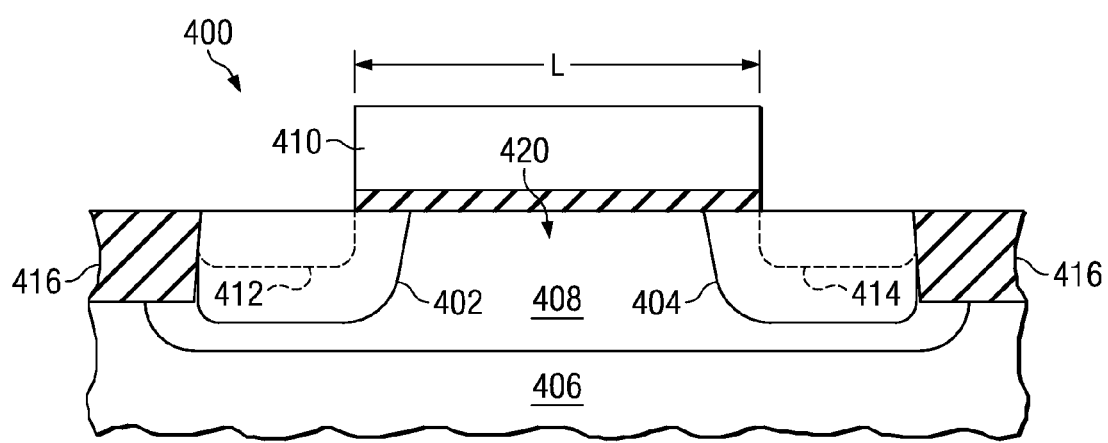

Referring now to FIGS. 4A-4B, one can see another symmetric drain extended device 400 that provides improved matching by including source and drain extension wells 402, 404, while at the same time limiting the area of the device. As shown, transistor 400 could be formed over a semiconductor body 406 that includes a substrate 406 and a well 408. Transistor 400 could also include a gate electrode 410 having gate length, L, which separates a source 412 from a drain 414. In some embodiments, the gate electrode 410 may also include spacers or other un-illustrated features. The source and drain regions 412, 414 are formed within the source and drain extension wells 402, 404, respectively.

Transistor 400 is surrounded by an isolation structure 416 that defines an isolated region 418 with different widths under the gate electrode 410. Typically, due to implant straggle of the high energy extension wells 402, 404, the minimum critical dimension of an extension well is several times larger than the minimum critical dimension of the isolated region 418. As a result, the minimum width of a rectangular drain extended device may be limited by the critical dimension of the extension well implant. For a fixed W/L ratio, this creates a minimum area of a rectangular device. An I-shaped or T-shaped isolated region relieves this constraint by allowing a wide well extension region while creating a constriction in the isolated region 418 under the gate electrode 410 that determines the electrical W/L of the device. As a result, it is expected that a symmetric drain extended device with an I-shaped or T-shaped isolated region will preserve the matching of the corresponding rectangular-isolated region drain symmetric extended device layout while saving area. For example, in FIG. 4A, the isolation structure 416 defines an I-shaped isolated region 418 in the semiconductor body, instead of the previously discussed rectangular isolated region 104.

Under the gate electrode 410, the isolated region 418 includes an I-shaped bulk region 420, and portions of the source and drain extension wells 402, 404. In one embodiment, the regions that separate the source and drain (i.e., bulk region 420, and source and drain extension wells 402, 404) may be referred to as a channel region, although other channel regions could have other components. Accordingly, during operation of the device 400, a channel of charged carriers could flow between source 412 and drain 414 within the channel region, which channel region has different widths $w_1$, $w_2$, $w_3$ under the gate electrode 410.

In one embodiment, these widths $w_1$, $w_2$, $w_3$ can be tailored such that two geometrically matched transistors in separate geometrically matched isolation structures have matched electrical characteristics, while also consuming a minimal area on the integrated circuit. In effect, this configuration may allow a designer to shrink the size of the device without sacrificing quality of matching between devices.

One can see that the I-shaped bulk region 420 has various widths $w_1$, $w_2$, $w_3$ under the gate 410. In the illustrated embodiment (where $w_2=w_3$), width $w_1$ is measured between a pair of opposing sidewalls 422A, 422B, $w_2$ is measured between opposing sidewalls 424A, 424B, and $w_3$ is measured between opposing sidewalls 426A, 426B. All of these sidewalls are adjacent to the isolation trench 416. In other embodiments (see e.g., FIG. 5), widths $w_2$ and $w_3$ may differ from one another.

In various embodiments where the device 400 is used in an analog manner, this width $w_1$ could typically be less than the gate length L. The widths $w_2$ and $w_3$ could also be less than or comparable to the gate length L. For example, width $w_1$ could be less than the gate length L by a factor of approximately 1 to approximately 50.

Figure 5:
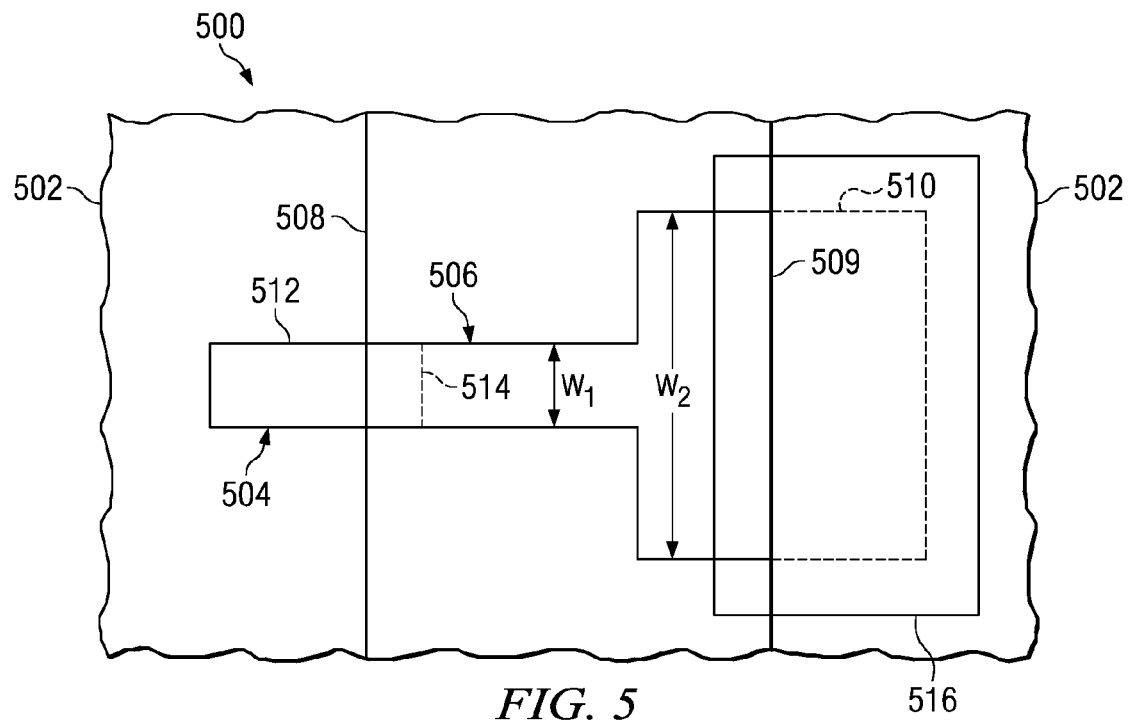
FIG. 5 shows a layout view of a T-shaped transistor in accordance with aspects of the present invention.

Referring now to FIG. 5, one can see another transistor 500 formed within a shallow trench isolation structure 502 that defines a T-shaped isolated region 504. As shown, in this embodiment, the isolated region 504 may include a T-shaped bulk region 506 with first and second widths $w_1$, $w_2$ between opposing edges 508, 509 of the gate electrode. The drain 510 may share the second width $w_2$, while the source 512 and pocket region 514 may share the first width $w_1$. Notably, in some embodiments, this transistor 500 may still have substantially the same matching ability as transistor 400, but consumes less area on the die. Although transistor 500 is shown with a drain extension well 516 (and not a source extension well), in other embodiments, the transistor 500 could include both a drain extension well and a source extension well.

Figure 6:
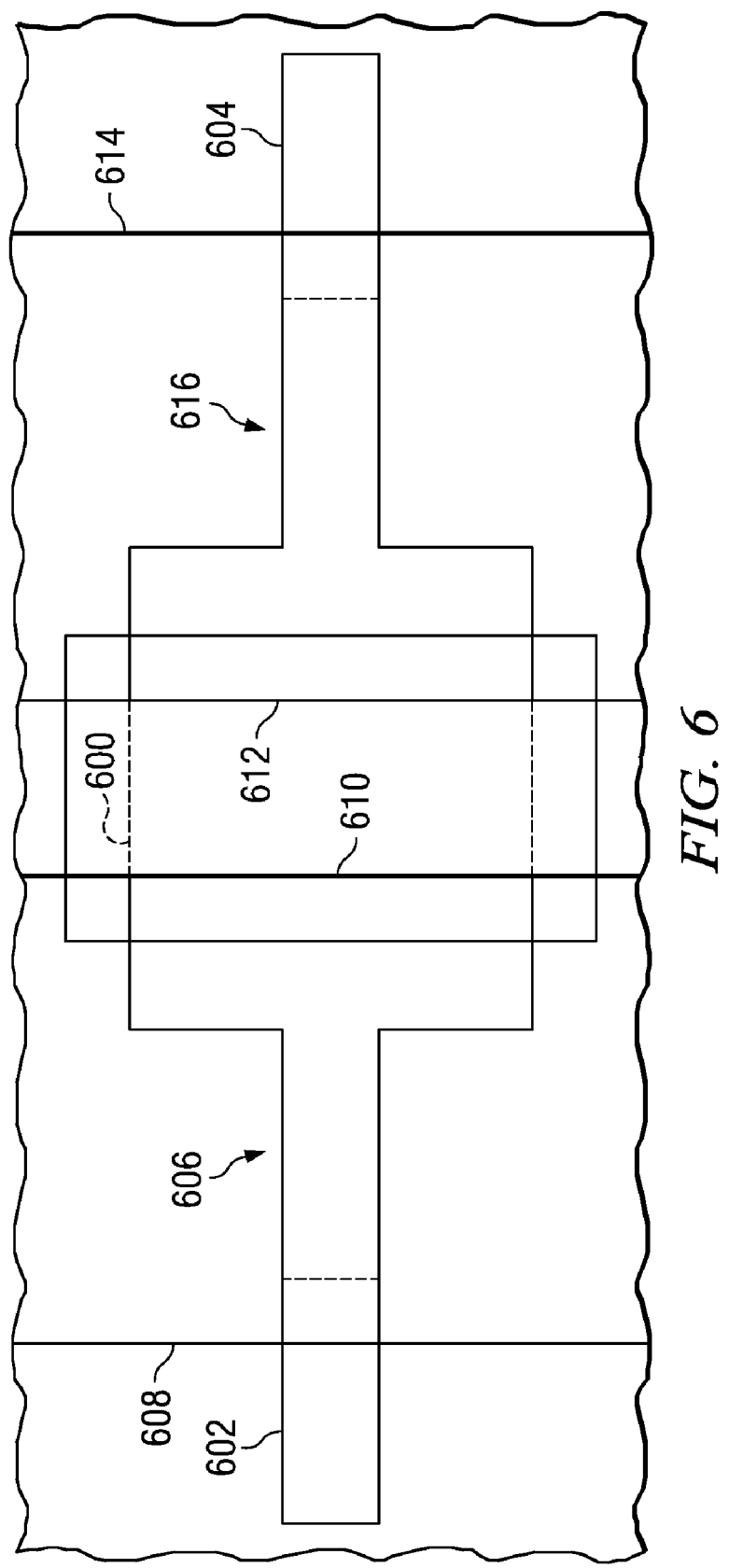
FIG. 6 shows a layout view of two T-shaped transistors in accordance with aspects of the present invention.

T-shaped transistors may be advantageous in that they can be tiled together in an interdigitated configuration. In an interdigitated configuration, the drains of the T-shaped transistors can share a common drain-extension well. For example, in FIG. 6, a common drain 600 is associated with two separate sources 602, 604. Between the first source 602 and the common drain 600, a T-shaped bulk region 606 may be formed under a gate electrode and between lateral edges 608, 610 thereof. Similarly, under another gate electrode and between lateral edges 612, 614 thereof, another T-shaped bulk region 616 may exist.

Figure 7:
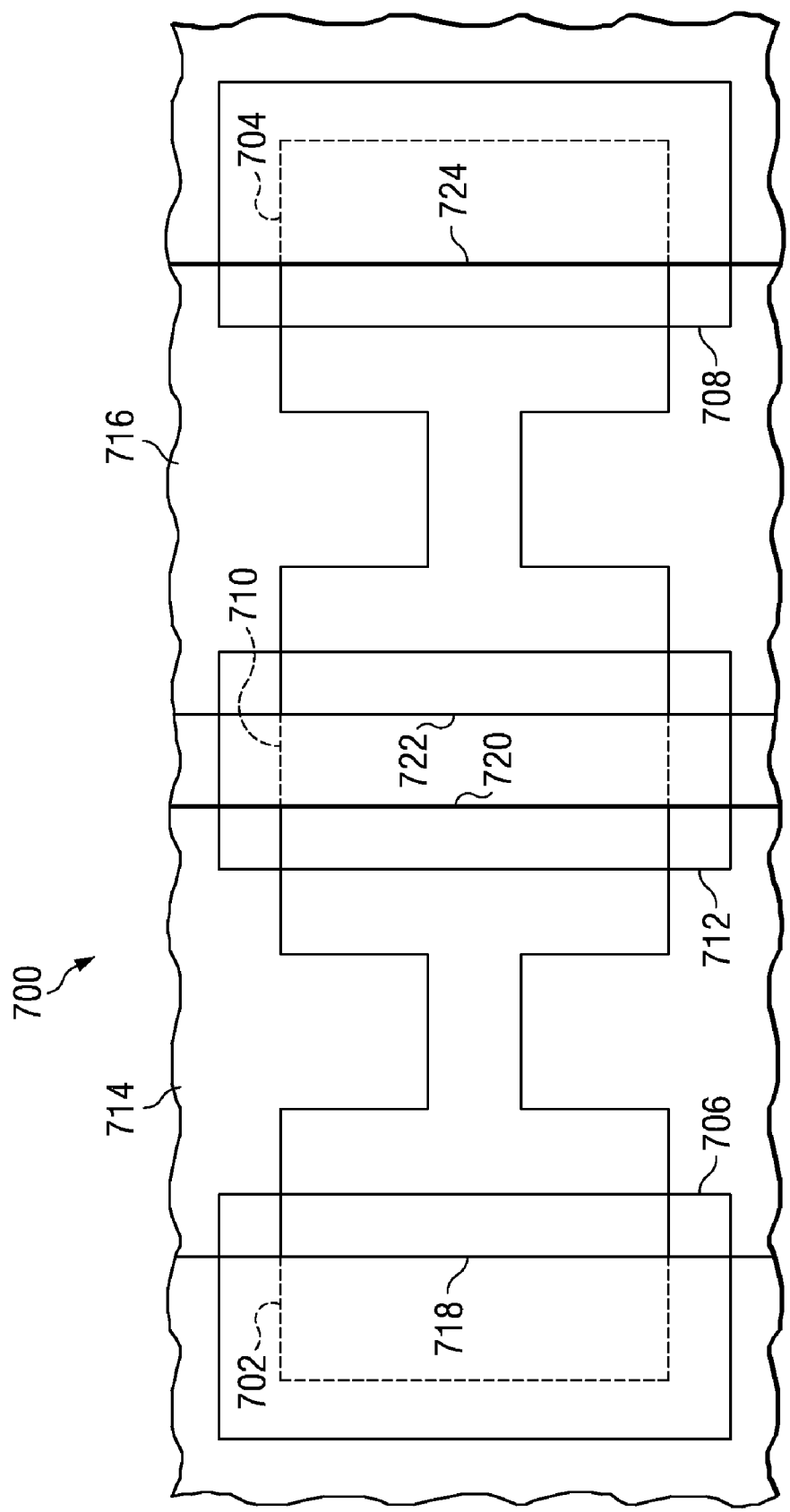
FIGS. 7-8 show layout views of two I-shaped transistors in accordance with aspects of the present invention.

FIG. 7 also shows a common drain configuration 700, but where the sources 702, 704 are associated with extension wells 706, 708, respectively, and where the common drain 710 also has an extension well 712 associated therewith. Again, gate electrodes 714, 716 with respective lateral edges 718, 720 and 722, 724, respectively, are also shown.

Figure 8:
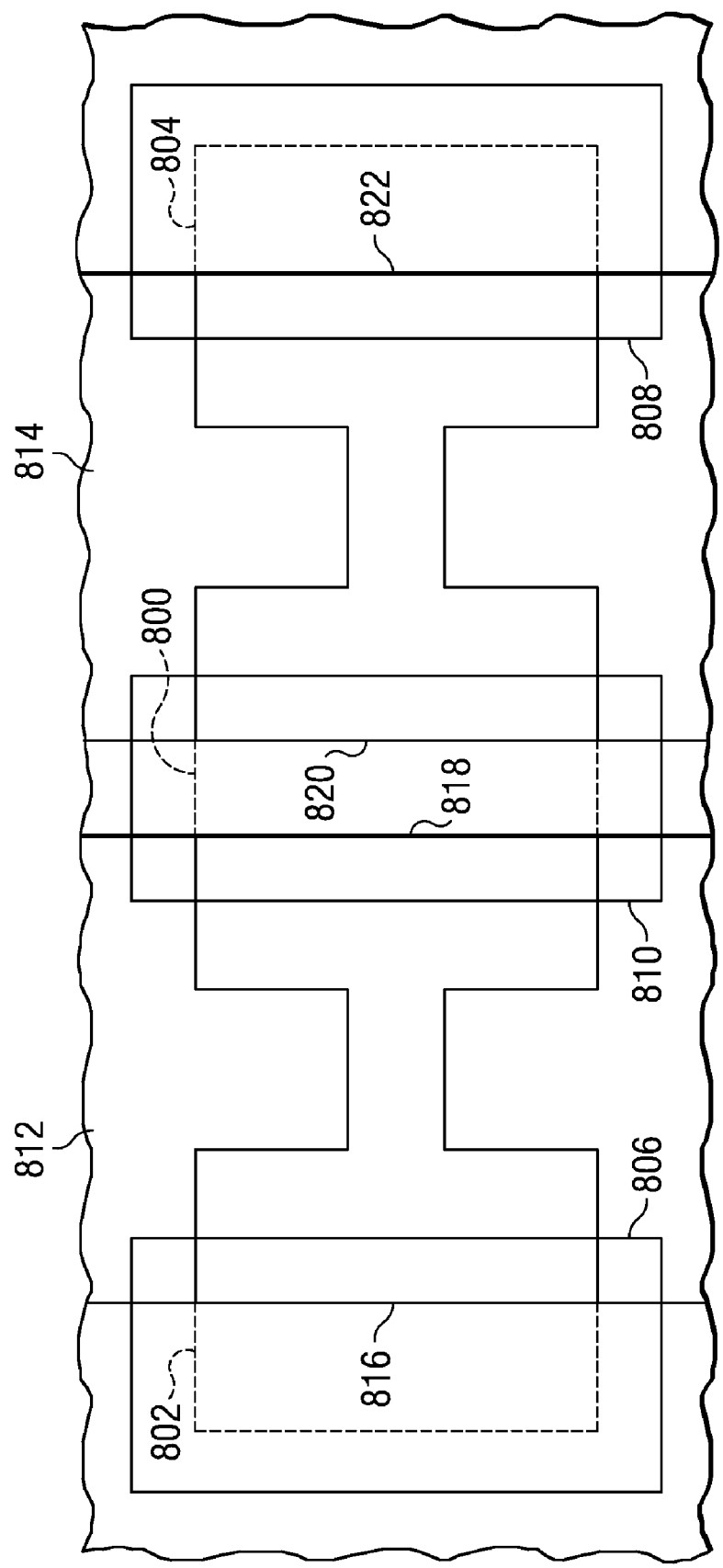

In FIG. 8, by contrast, a common source 800 is associated with two separate drains 802, 804. Both the drains 802, 804 have extension wells 806, 808, respectively, and the source 800 also has an extension well 810 associated therewith. Again, gate electrodes 812, 814 with respective lateral edges 816, 818 and 820, 822, respectively, are also shown.

Although not shown explicitly in the figures, the corners in the I-shaped or T-shaped layouts could be limited to minimize electrical stresses or lithography sensitivity. For example, tapered or rounded corners could minimize current crowding. In various embodiments, these corners could follow a Fermi-function shape.

Referring now to FIGS. 9-19, one can see some examples of methods for making the structures described above. Although these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Figure 9:
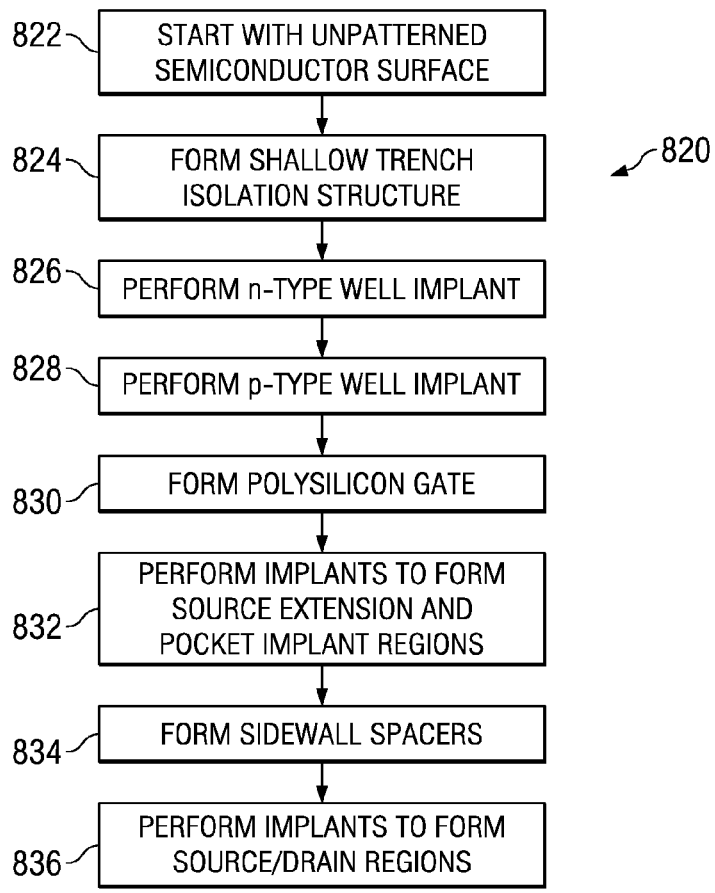
FIG. 9 shows a method for manufacturing a transistor in accordance with aspects of the invention.

Referring now to FIG. 9, one can see a method 820 that starts at block 822 with an un-patterned semiconductor surface. In block 824, a shallow trench isolation structure is formed in the semiconductor body to isolate individual devices or groups of devices. In block 826, an n-type well implant is performed. This n-type implant could form an n-well for low voltage devices and a drain extended n-well for high-voltage devices. In block 828, a p-type well implant is performed. This p-type implant could form a p-well for low voltage devices and a compensated p-well for high voltage devices. In block 830, a polysilicon gate is formed over the structure. In block 832, implants could be performed to form the source extension regions and the pocket implant regions. In block 834, spacers are formed. In block 836, implants are performed to form source and drain regions.

FIGS. 10-21 each show a transistor at various stages of manufacture. These figures show one example of some structures that could correspond to the blocks of method 900. More particularly, these figures show top-layout views (FIGS. 10A, 11A, 12A, etc.), and cross-sectional views (FIGS. 10B-10C, 11B-11C, 12B-12C, etc.) as indicated. Although FIGS. 10C, 11C, 12C, etc. show the formation of an n-type device, note that there is no top-level view shown that corresponds to this n-type device. Some layers may not be shown in all of the figures for purposes of clarity and readability.

Figure 10A:
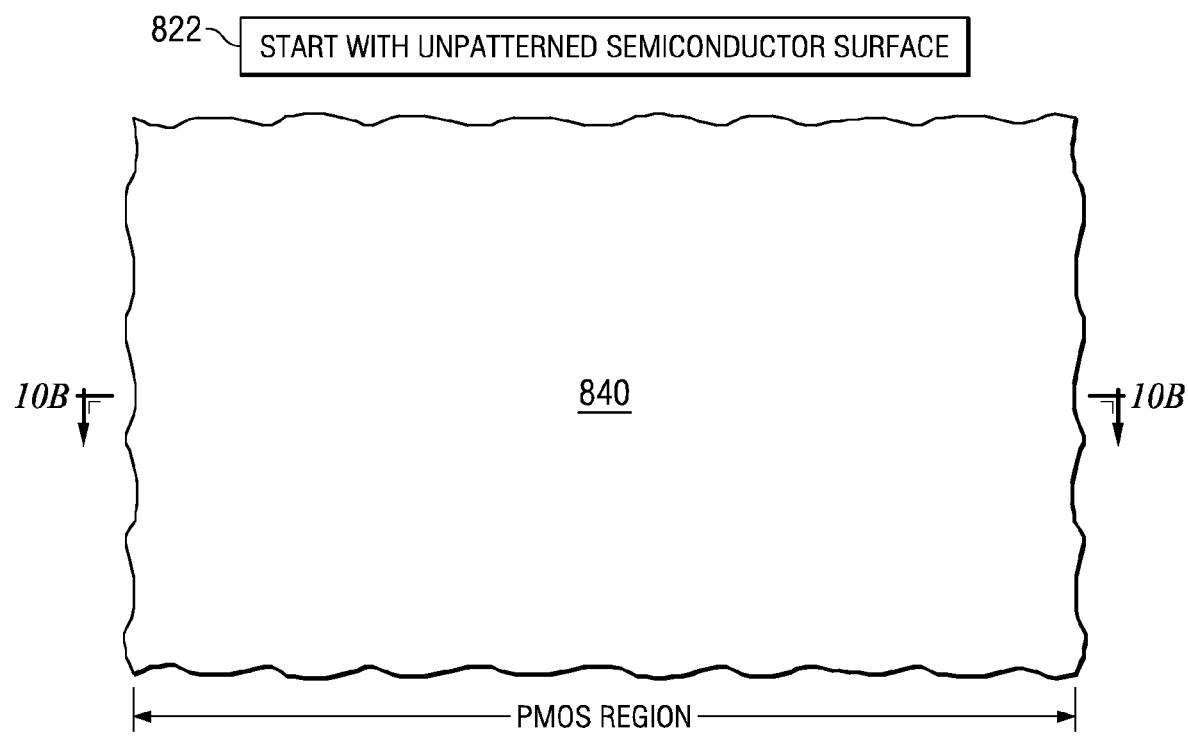
FIGS. 10-21 show a transistor at various stages of manufacture, in accordance with one embodiment of the method shown in FIG. 9.
Figure 10B:
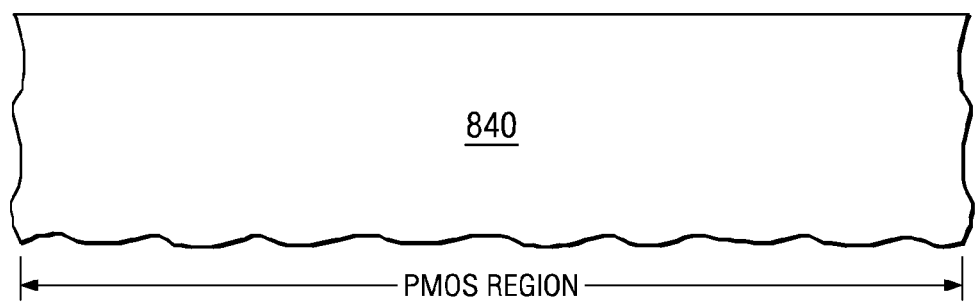
Figure 10C:
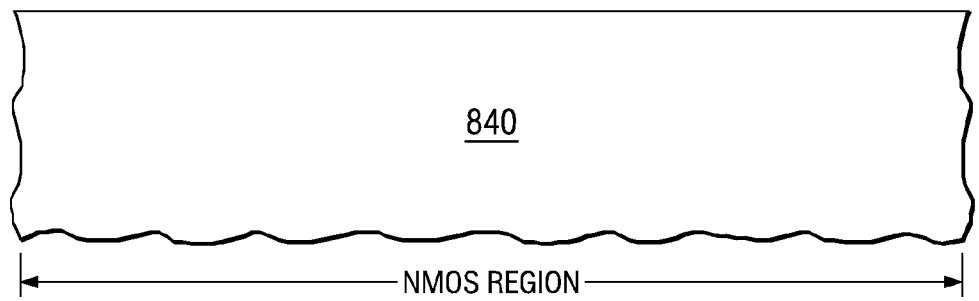

In FIG. 10A-10C, one can see a semiconductor substrate 840, which could comprise a Si, GaAs, SiGe, Silicon-on-insulator, or any other semiconductor substrate. In one embodiment, the substrate could be a lightly doped p-type silicon wafer. In some embodiments, the substrate may include devices or device features.

Figure 11A:
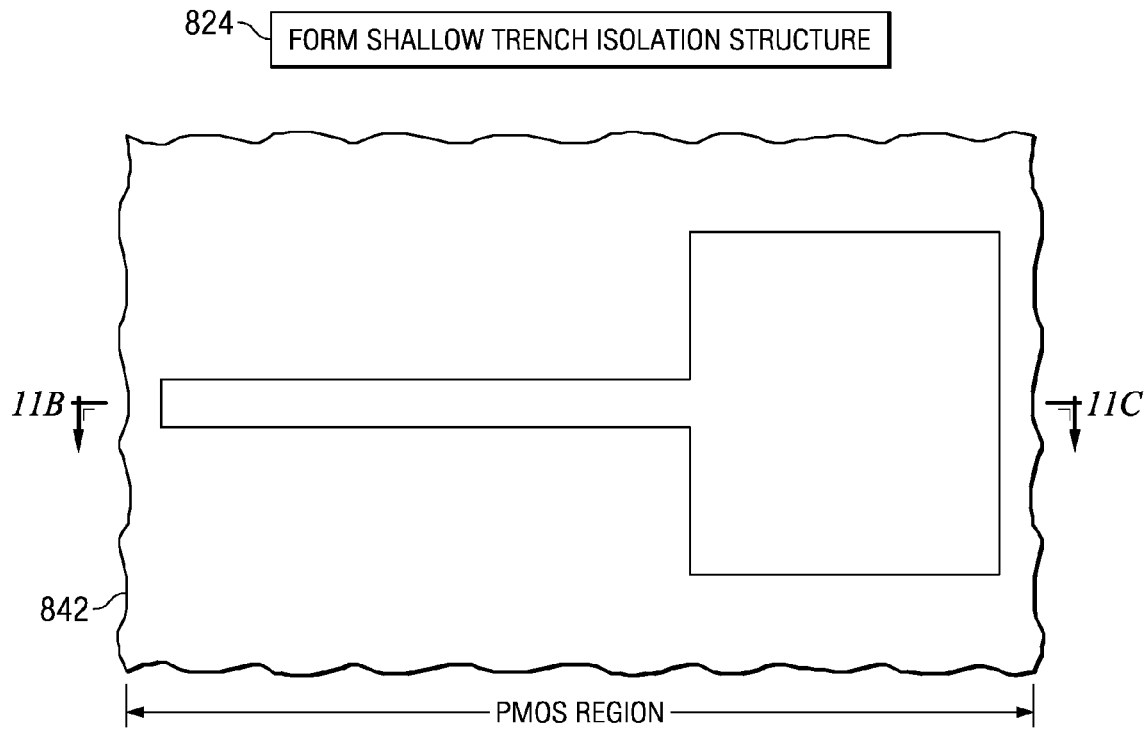
Figure 11B:
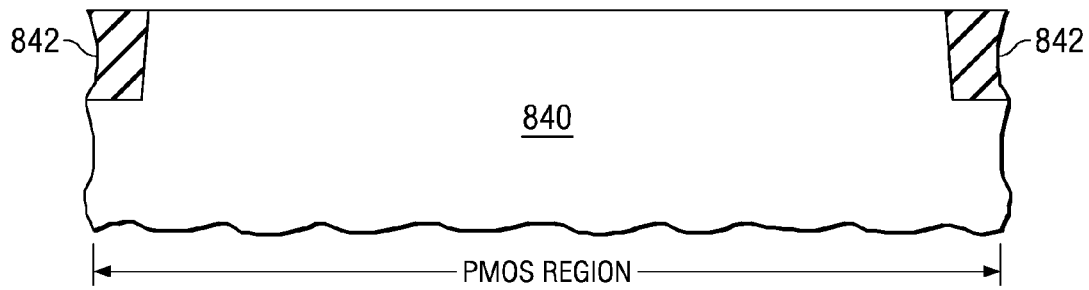
Figure 11C:
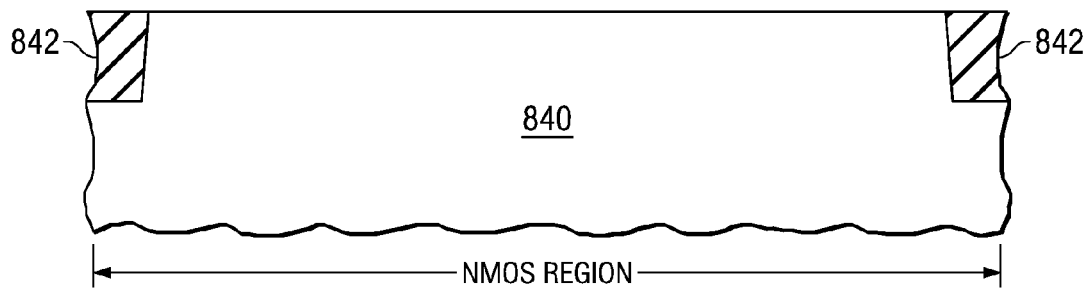

In FIGS. 11A-11C, one can see an isolation structure 842 that is formed within the semiconductor body. In one embodiment, the isolation structure could be formed by forming a pad oxide, then forming a nitride mask thereover. The nitride could then be patterned and the isolation trenches could be etched, for example to a depth of approximately 0.5 um. A liner oxidation could then be performed, and the trench then be filled with oxide. Chemical mechanical polishing (CMP) could then be performed, after which the nitride mask could be stripped.

Figure 12A:
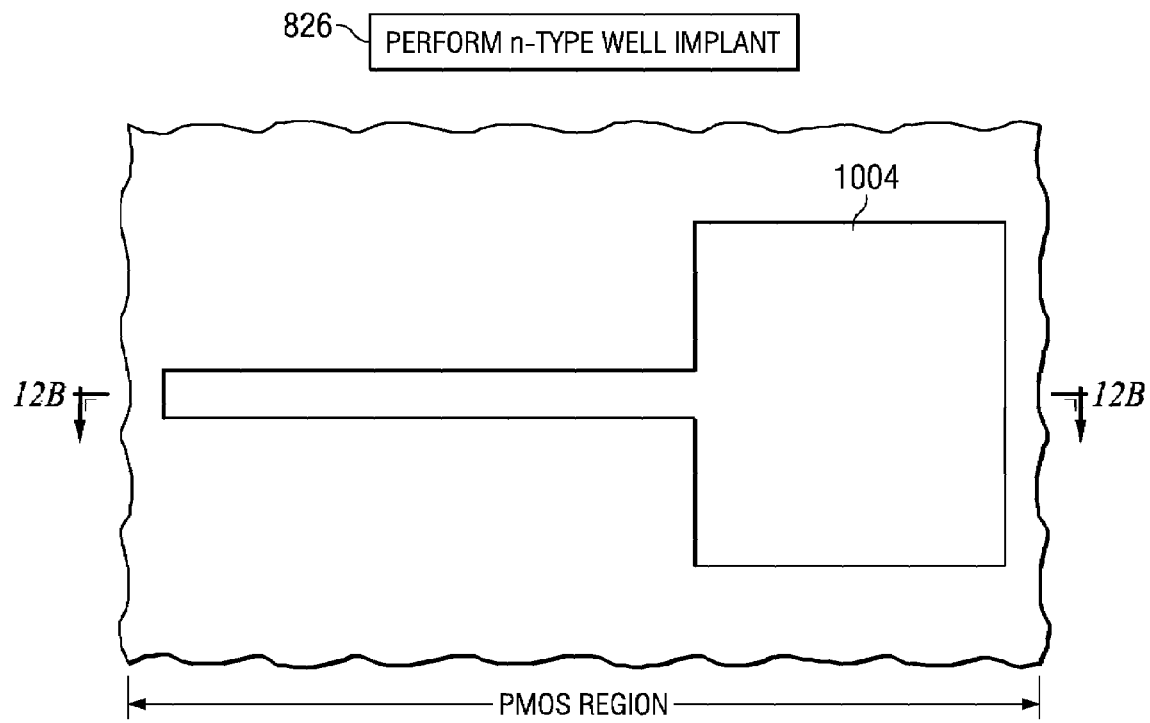
Figure 12B:
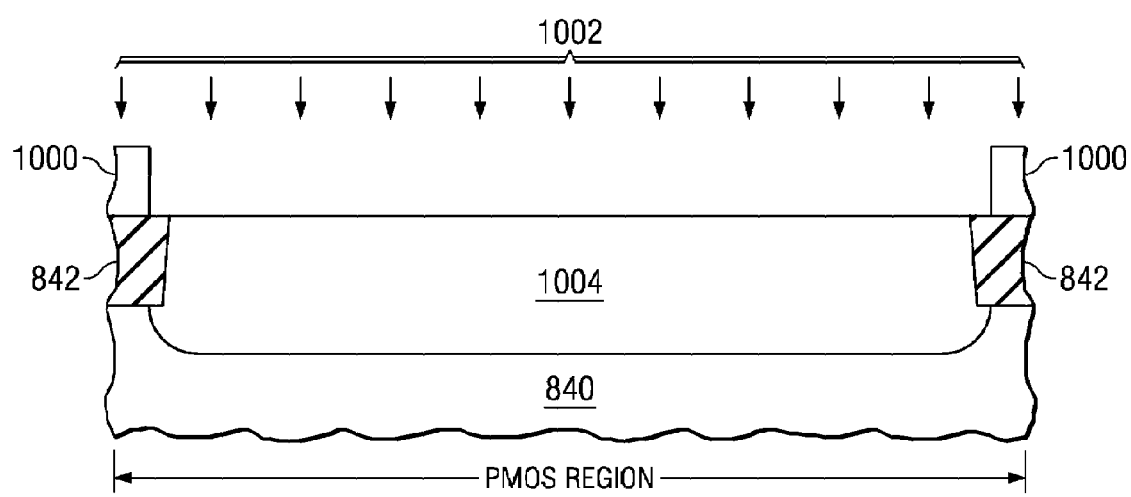
Figure 12C:
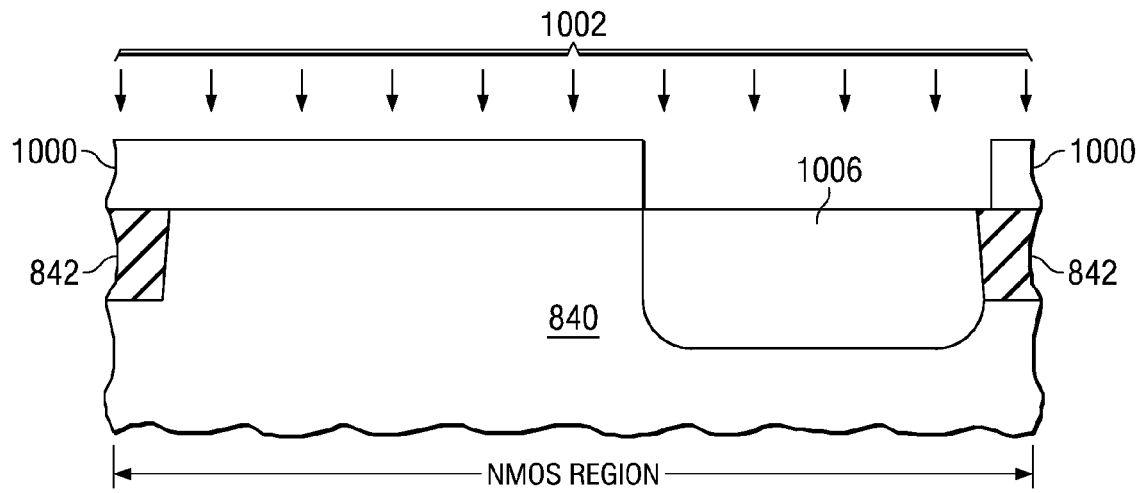

In FIGS. 12A-12C, an n-well mask 1000 is patterned and a series of implants is performed to help set the voltage threshold ($V_T$) of the devices, to avoid source-drain punchthrough, to stop parasitic channel formation under the STI, and finally to form the n-well. In one embodiment, the n-well implant could be a deep phosphorous implant (approximately 400-600 kev) that simultaneously creates the n-type bulk region 1004 in the PMOS transistors and the n-well drain extensions 1006 in the NMOS transistors.

Figure 13A:
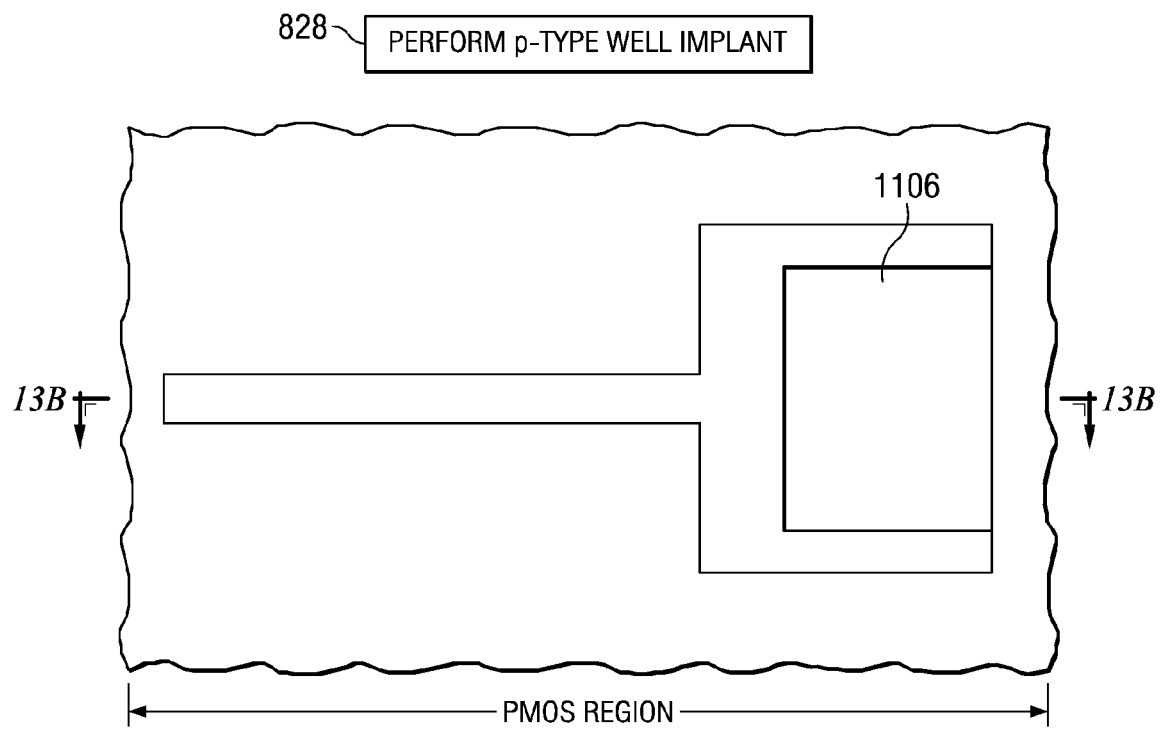
Figure 13B:
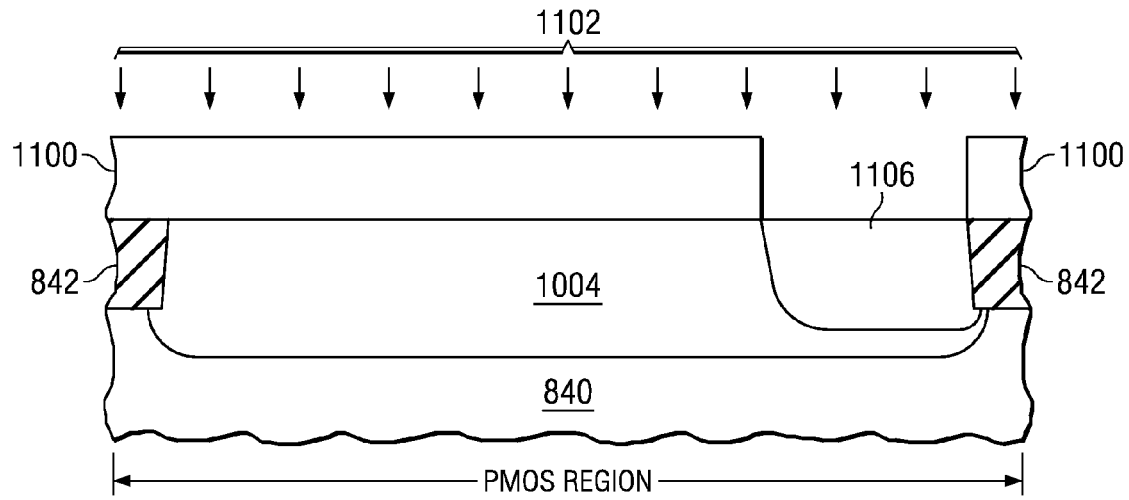
Figure 13C:
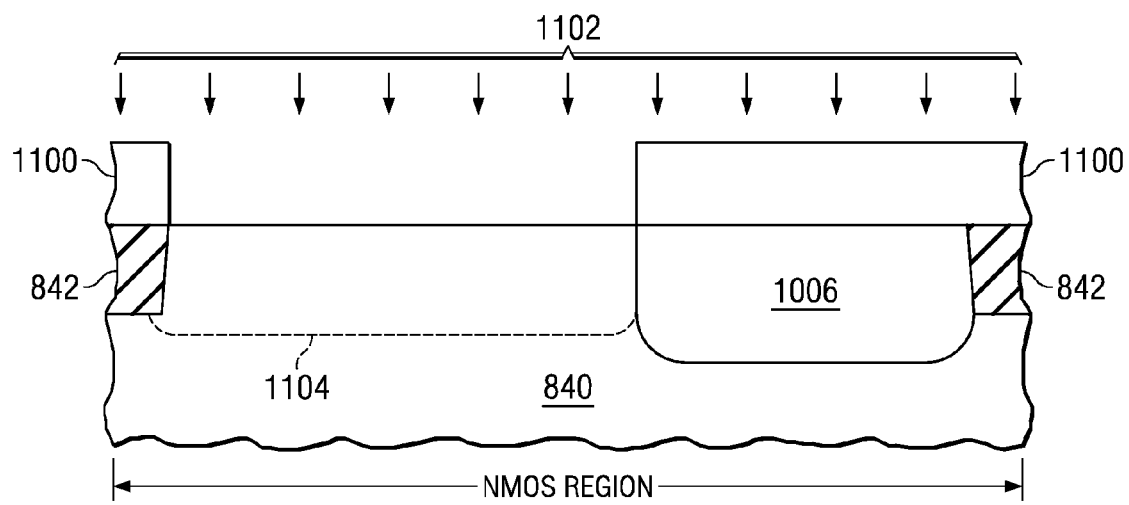

In FIGS. 13A-13C, the n-well mask has been stripped and a p-well mask 1100 has been patterned so suitable p-type implants 1102 can be performed. In one embodiment, these implants could include: a $V_{TN}$ implant (e.g., a shallow boron implant) that sets NMOS $V_T$, a punchthrough implant (e.g., a deeper boron implant) that prevents source-drain punchthrough, a channel stop implant to avoid parasitic channel formation under the STI, and the p-well implant. In an embodiment where the substrate is p-type, a p-well 1104 could be implanted within the substrate 800 to provide the body for NMOS devices. If n-well and p-well are co-implanted, it can result in a shallow p-type region 1106 surrounded by n-well, which is one type of drain extended well. This shallow p-type region surrounded by n-well may be referred to in some embodiments as a compensated p-well and is advantageous in that it may eliminate at least one mask step compared to some other processes.

Figure 14A:
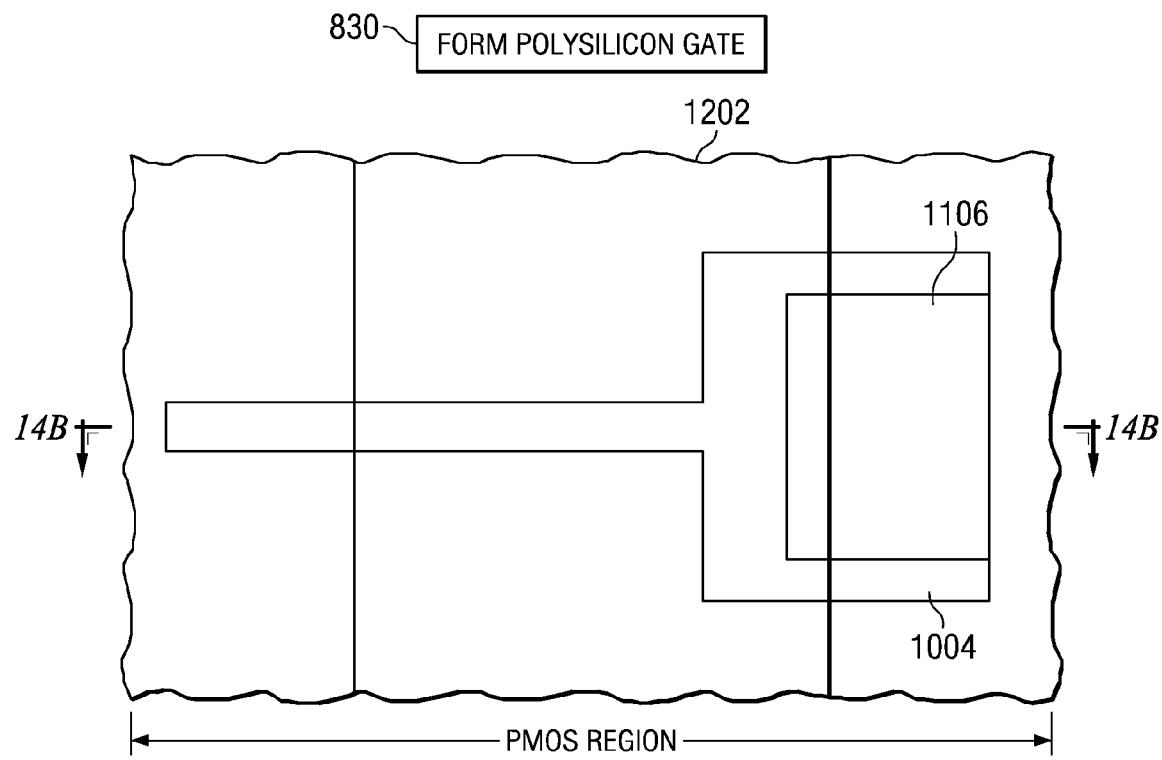
Figure 14B:
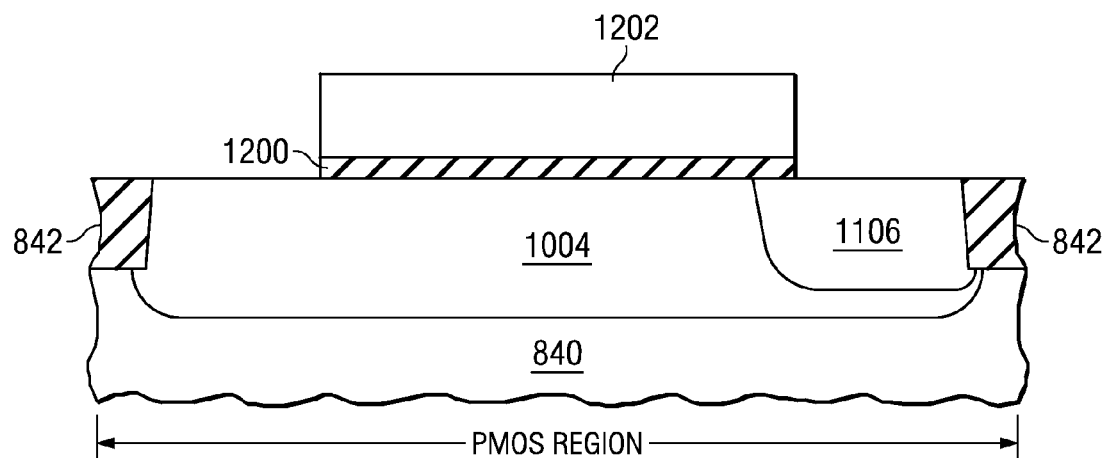
Figure 14C:
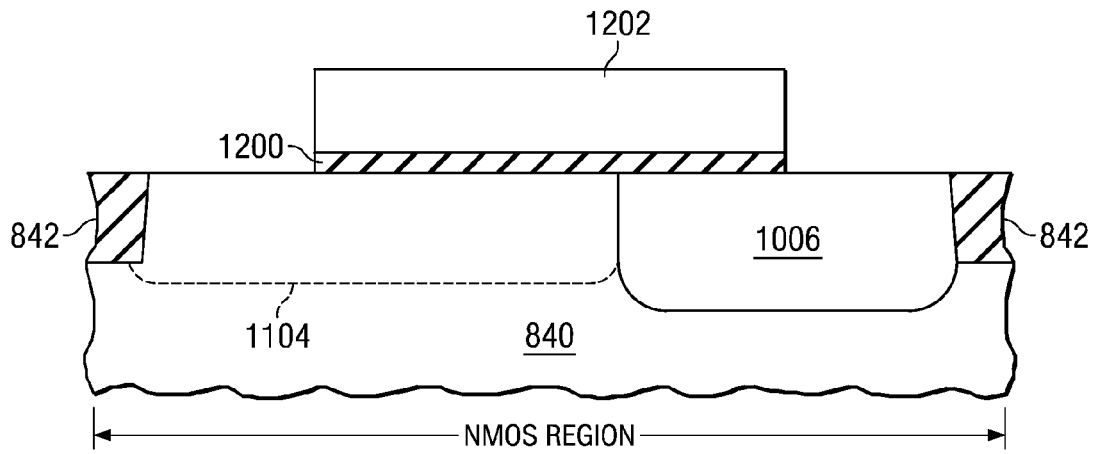

In FIGS. 14A-14C, the p-well mask has been stripped after which gate dielectric 1200 and gate electrode 1202 have been formed and patterned. In various embodiments, this gate electrode could comprise metal or polysilicon.

Figure 15A:
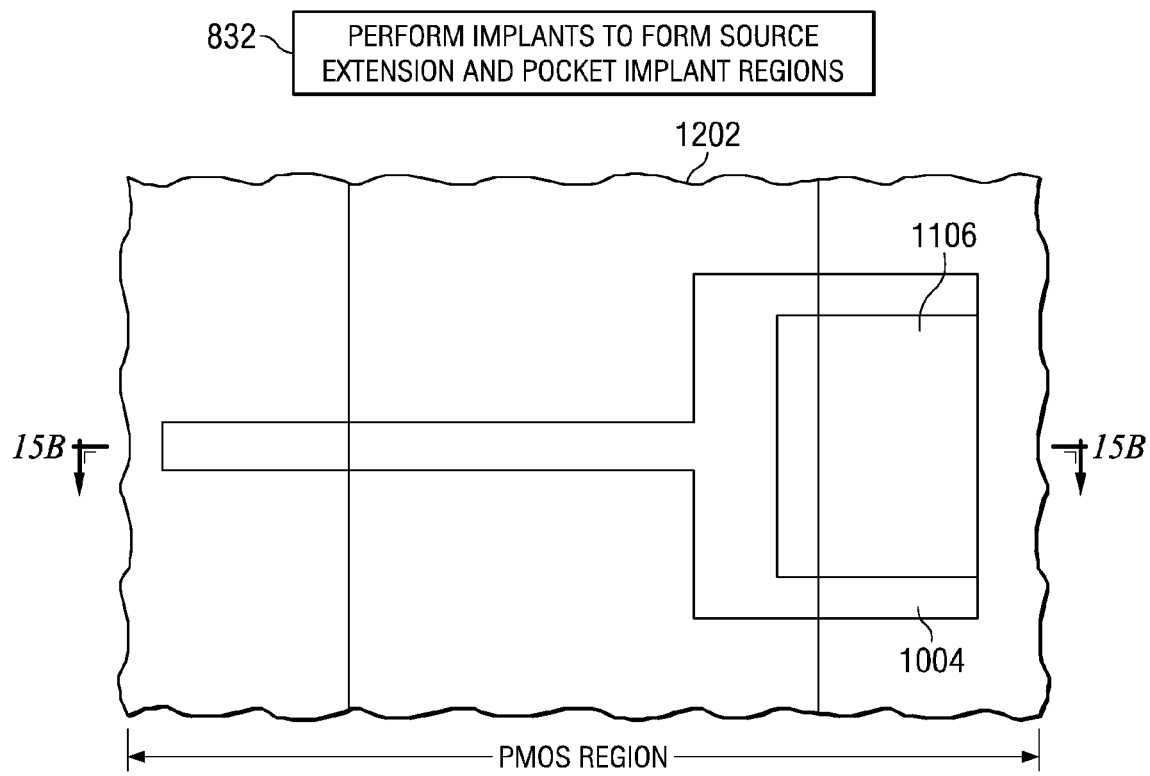
Figure 15B:
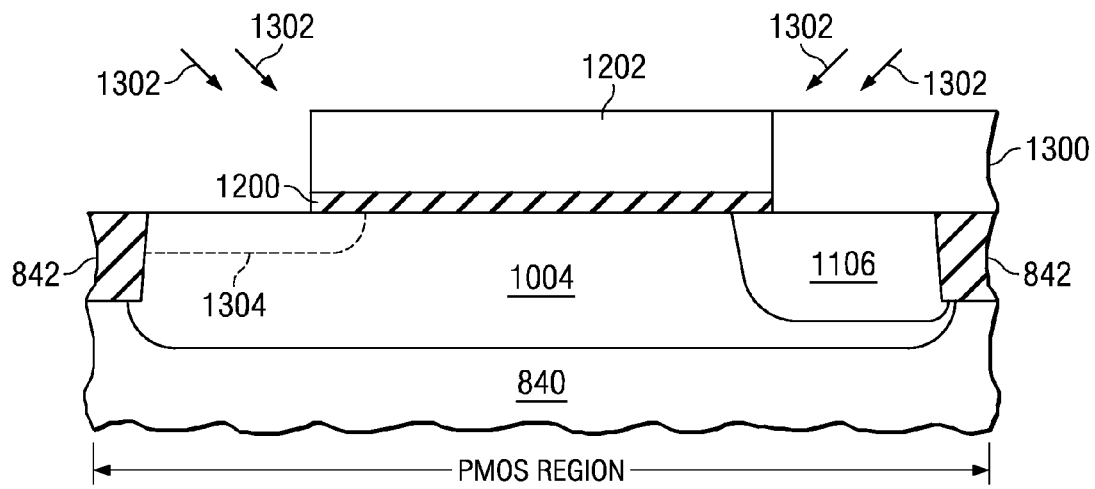
Figure 15C:
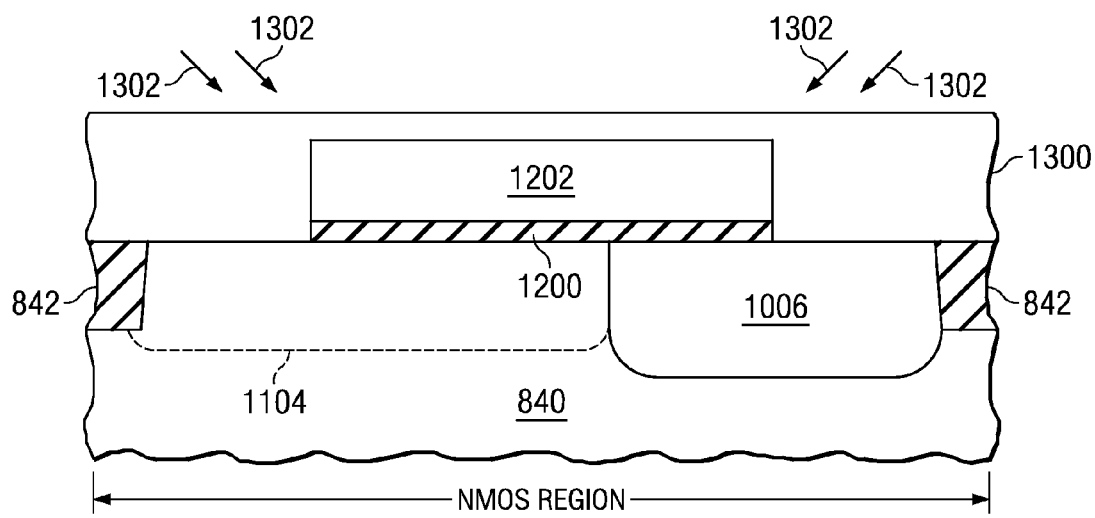

In FIGS. 15A-15C, a first pocket implant/drain extension mask 1300 has been patterned. This mask could cover the NMOS devices as well as the drain regions of the PMOS devices. As shown in FIGS. 15B-15C, an angled n-type pocket implant 1302 is performed to form the pocket regions 1304 associated with the source region of the PMOS devices.

Figure 16A:
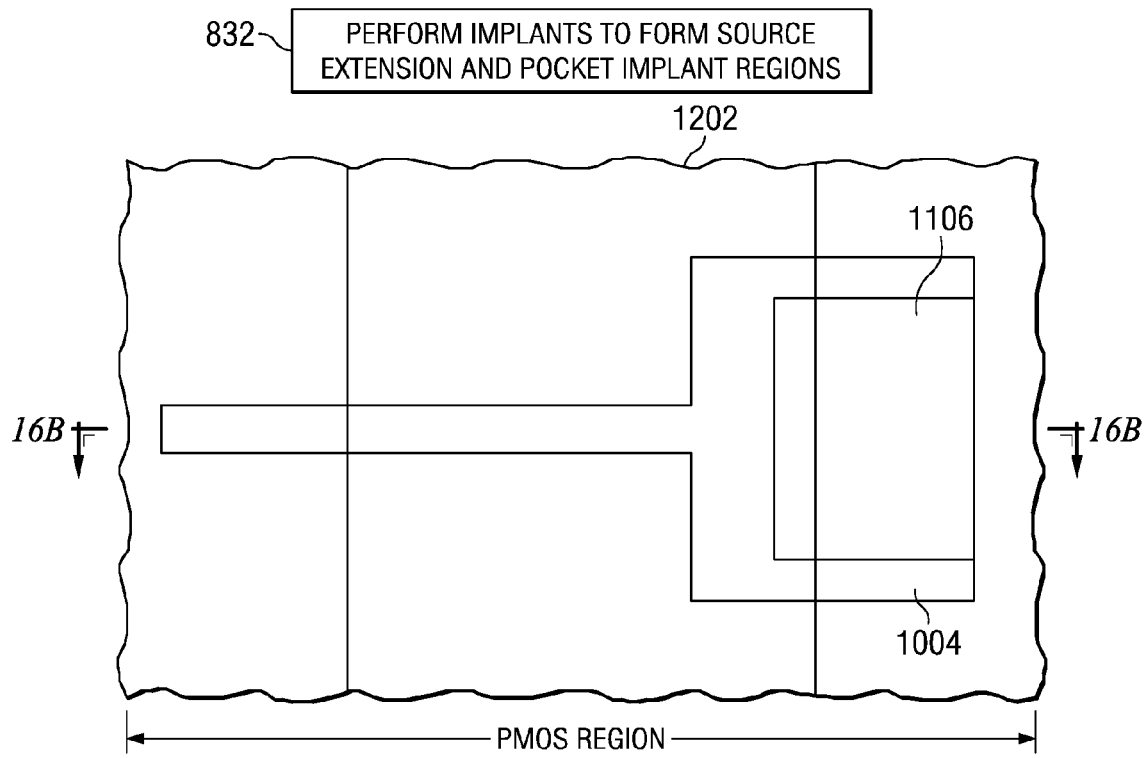
Figure 16B:
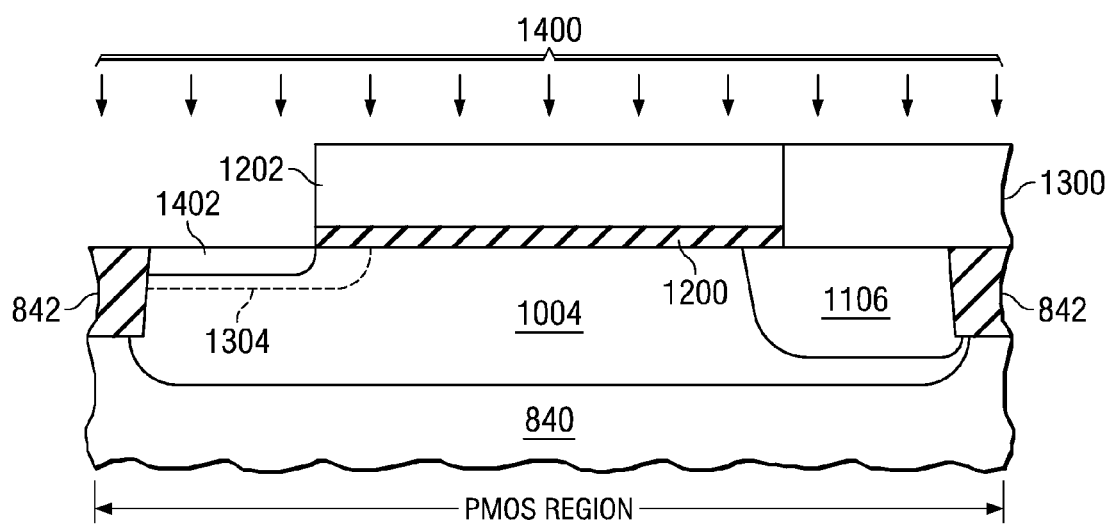
Figure 16C:
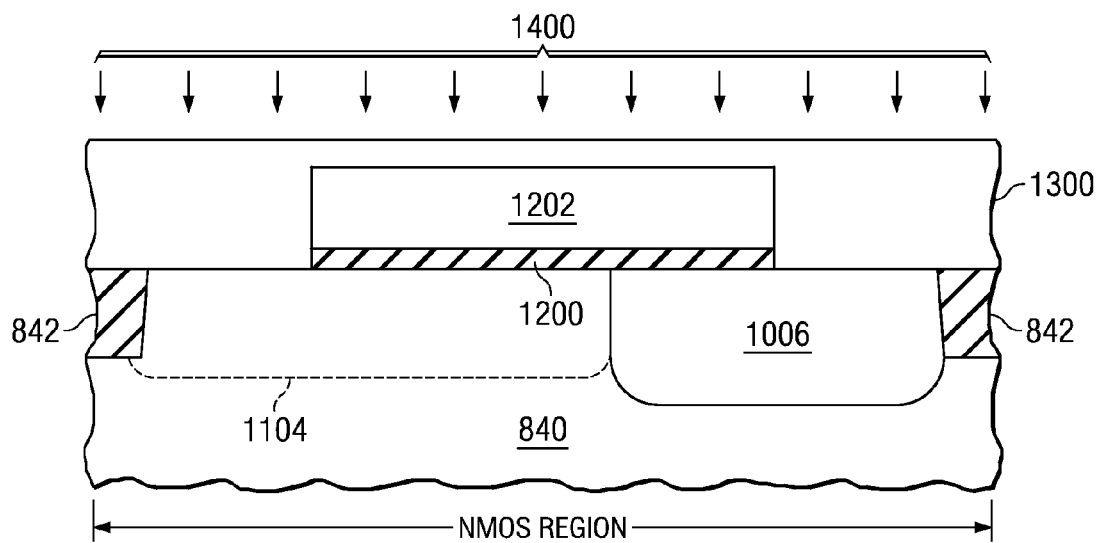

In FIGS. 16A-16C, while the first pocket implant/drain extension mask 1300 is still in place, a vertical (self-aligned) p-type extension implant 1400 can be performed to form the MDD region 1402 associated with the PMOS source region. LDD or HDD regions could also be formed.

Figure 17A:
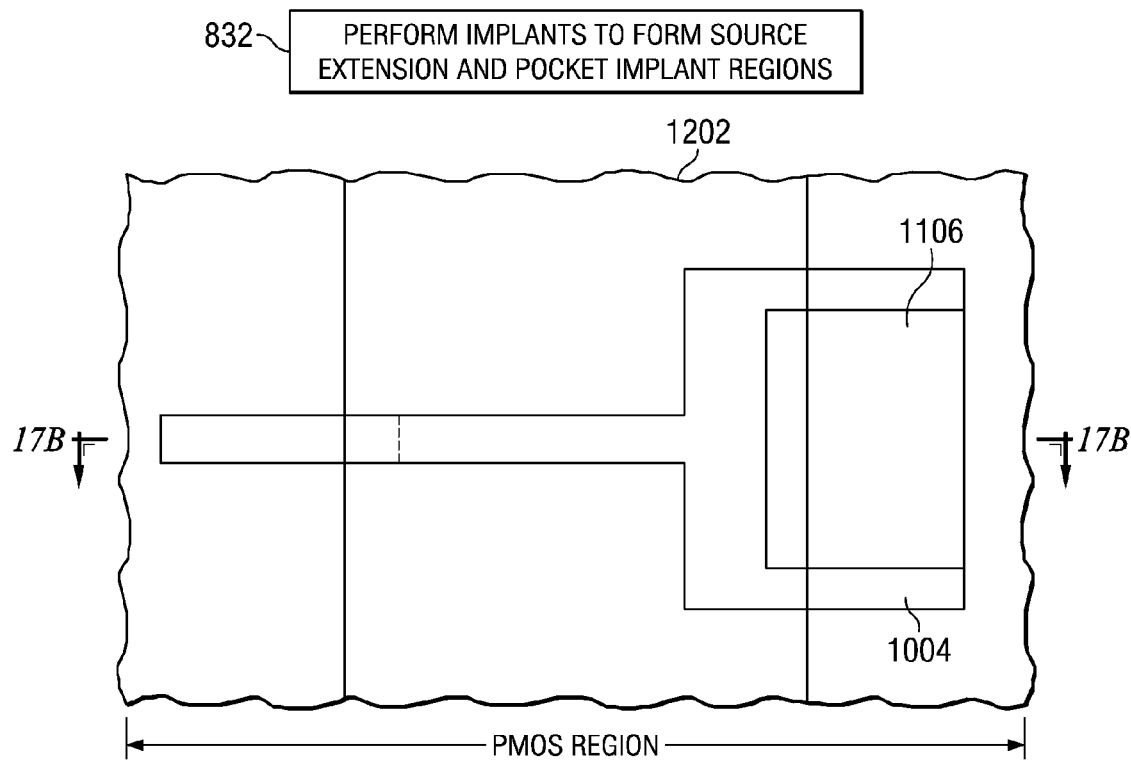
Figure 17B:
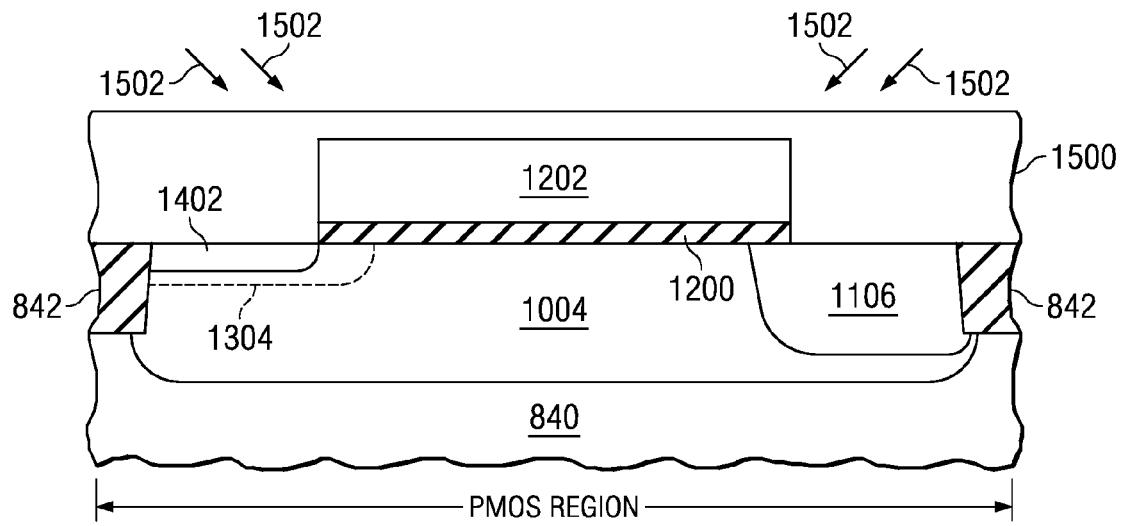
Figure 17C:
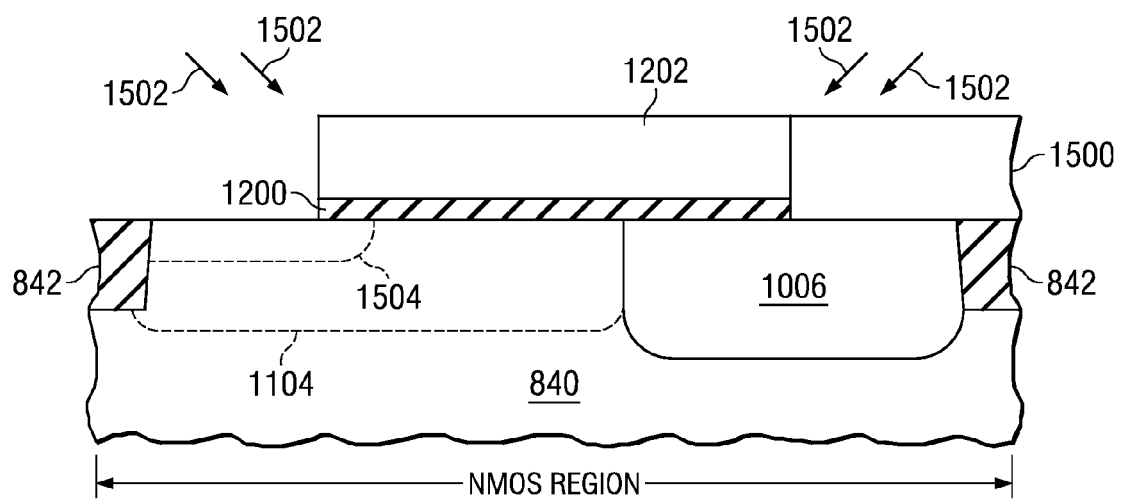

In FIGS. 17A-17C, the first pocket implant/drain extension mask has been stripped and a second pocket implant/drain extension mask 1500 has been patterned. This mask could cover the PMOS devices as well as the drain regions of the NMOS devices with a well extension (drain in this case). As shown in FIGS. 17B-17C, an angled p-type pocket implant 1502 is performed to form the pocket regions 1504 associated with the source region of the NMOS devices.

Figure 18A:
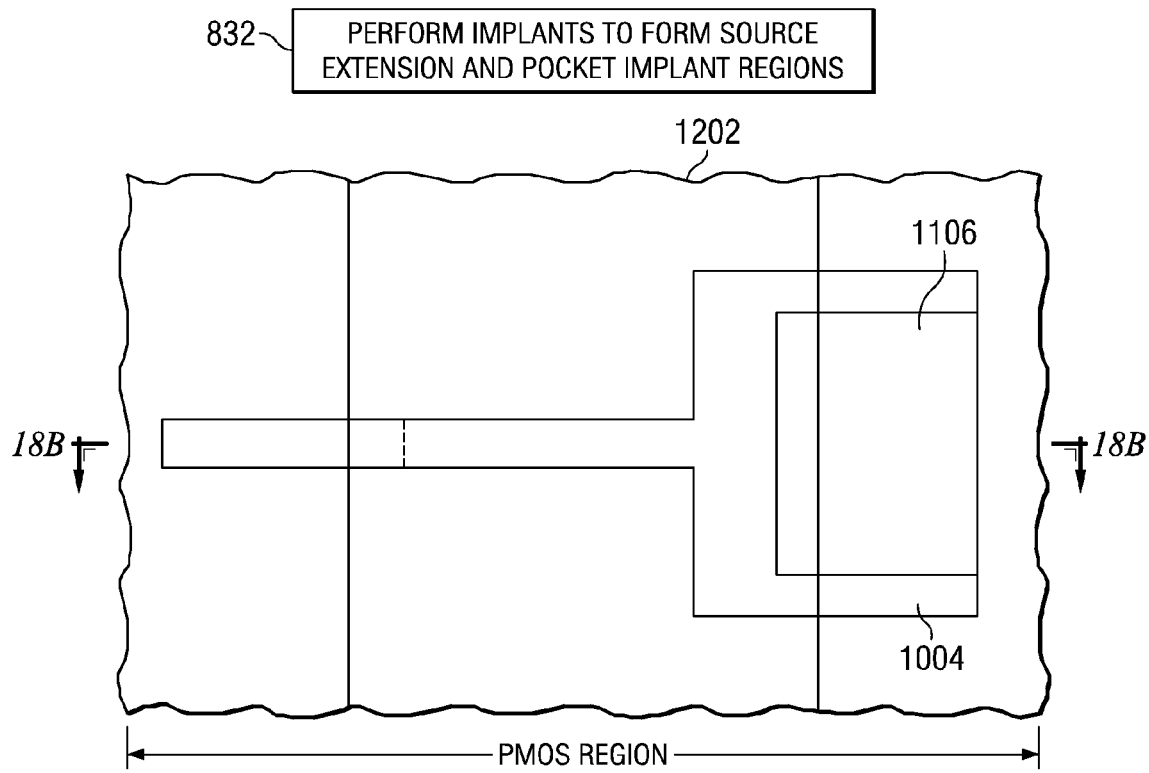
Figure 18B:
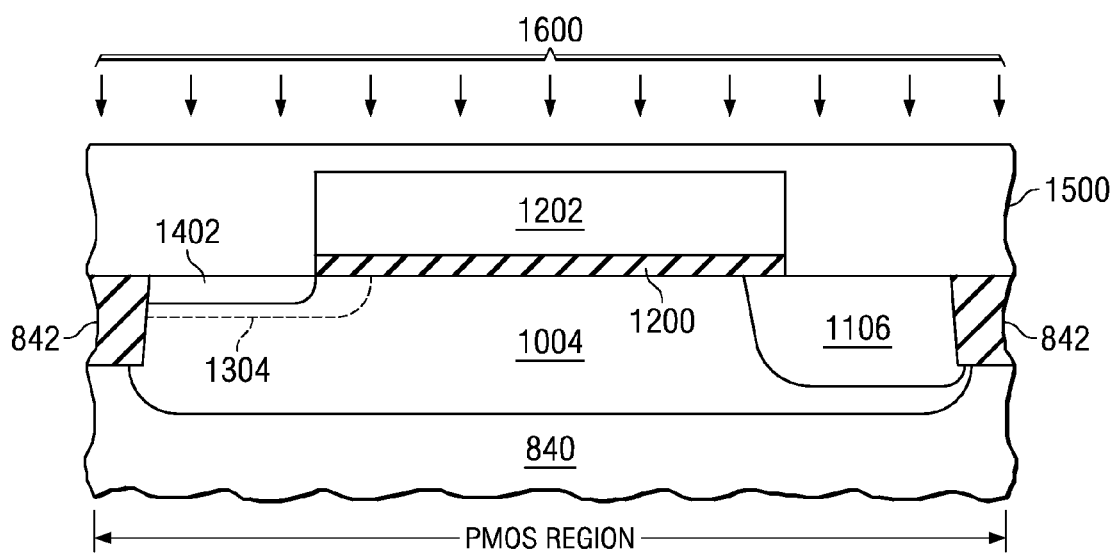
Figure 18C:
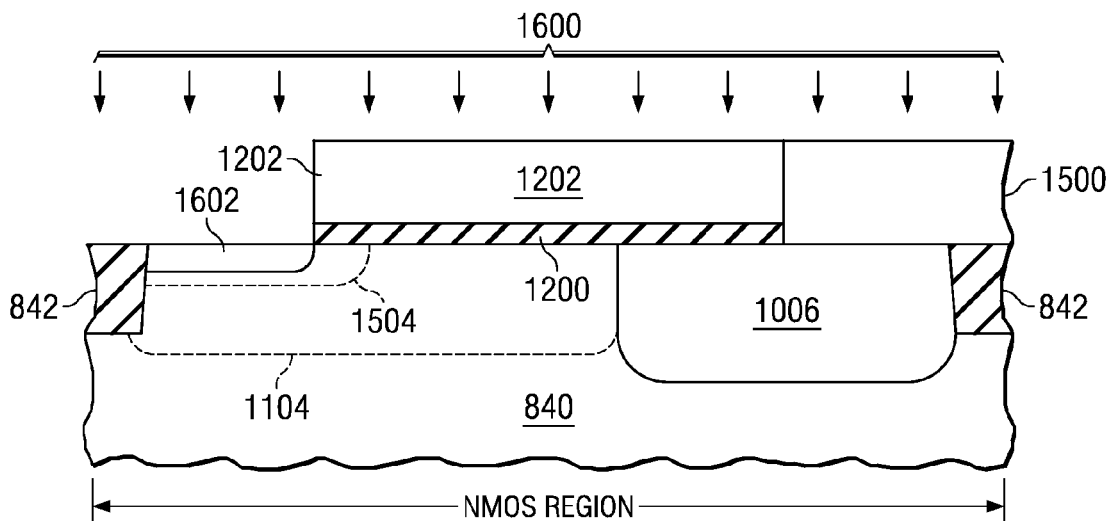

In FIGS. 18A-18C, while the second pocket implant/drain extension mask 1500 is still in place, a vertical (self-aligned) n-type extension implant 1600 can be performed to form the MDD region 1602 associated with the NMOS source region.

Figure 19A:
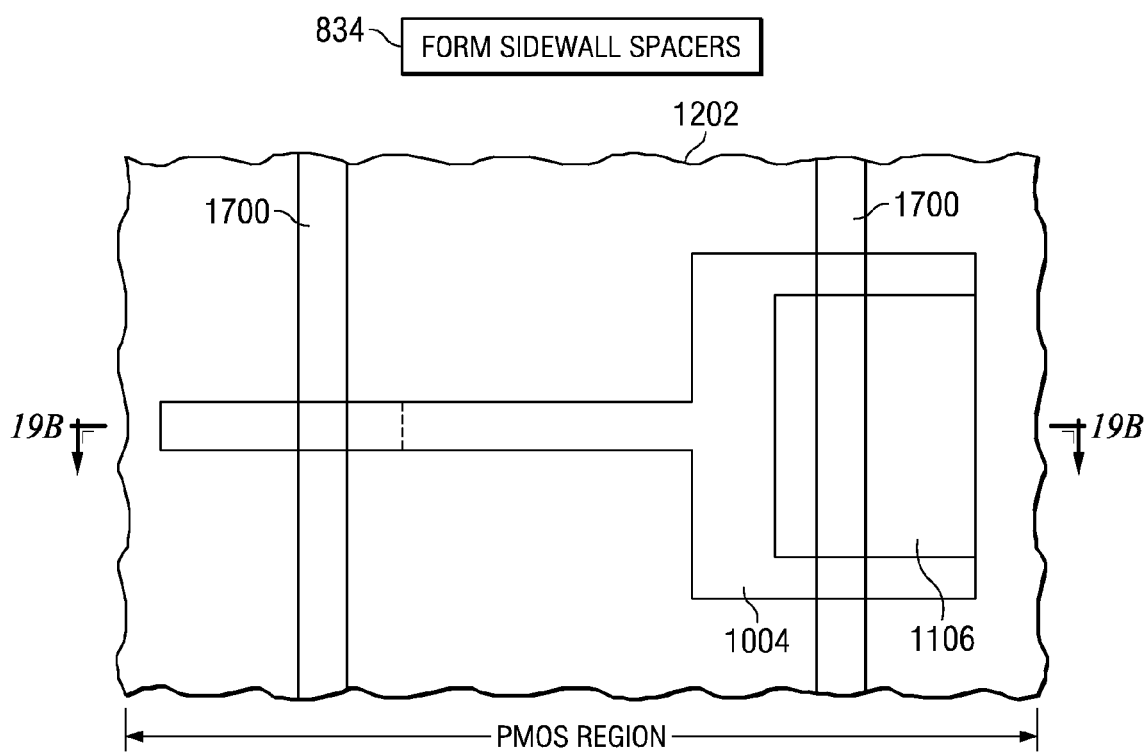
Figure 19B:
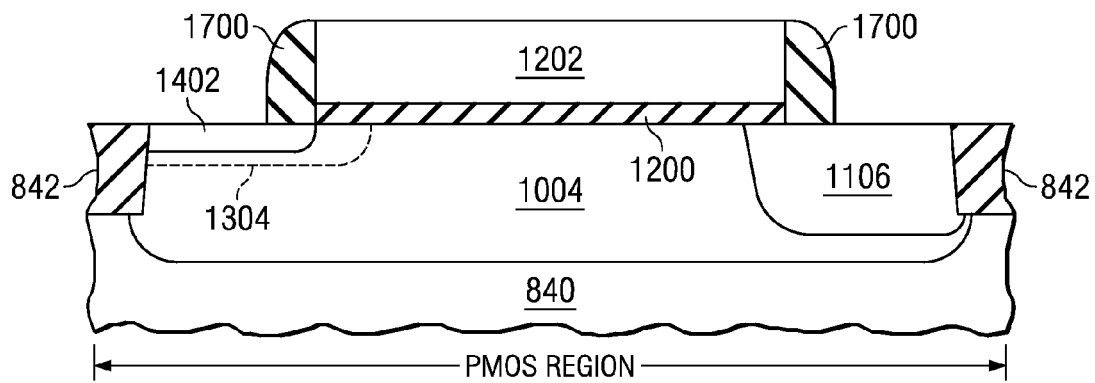
Figure 19C:
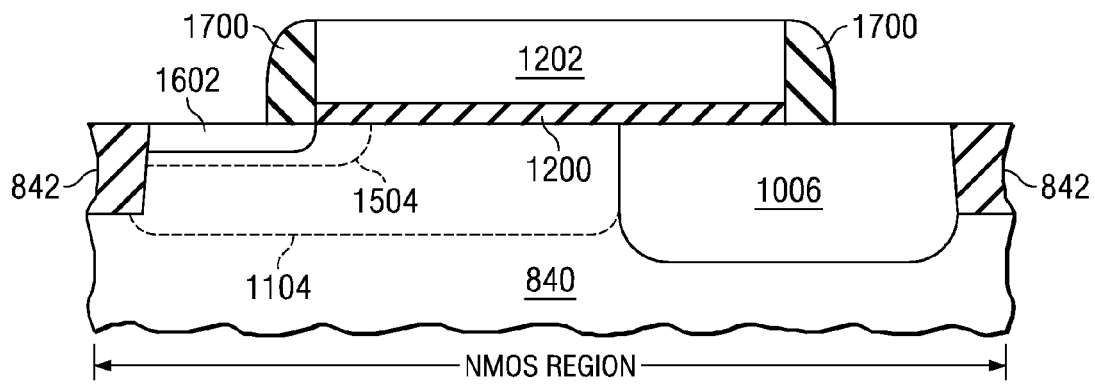

In FIGS. 19A-19C, sidewall spacers 1700 have been formed.

Figure 20A:
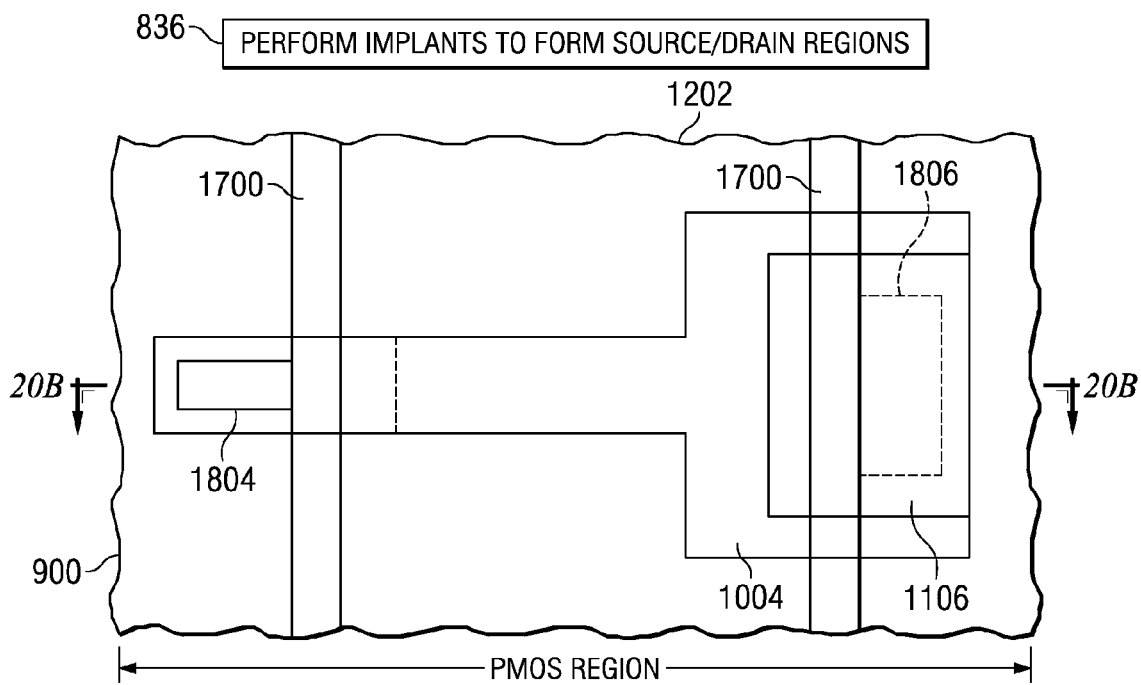
Figure 20B:
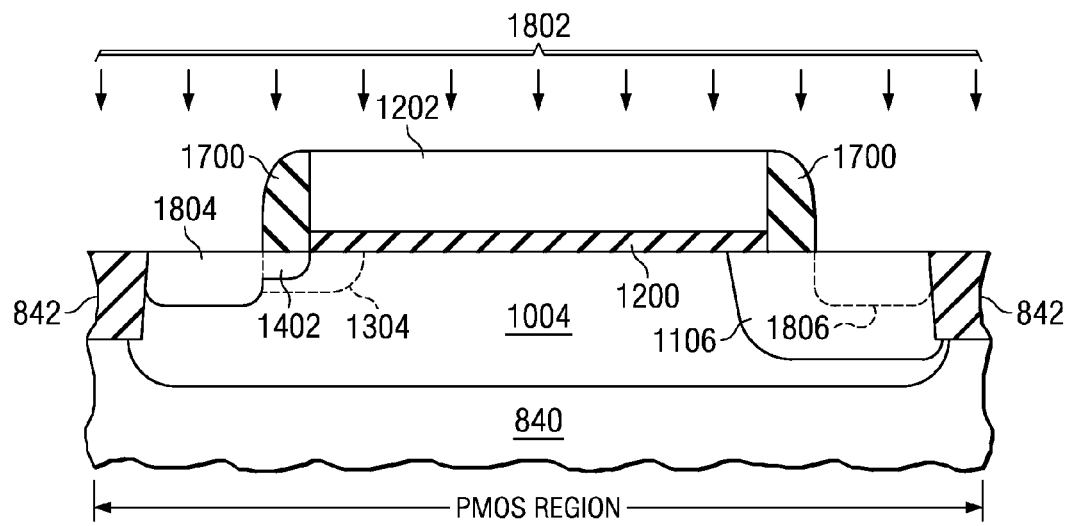
Figure 20C:
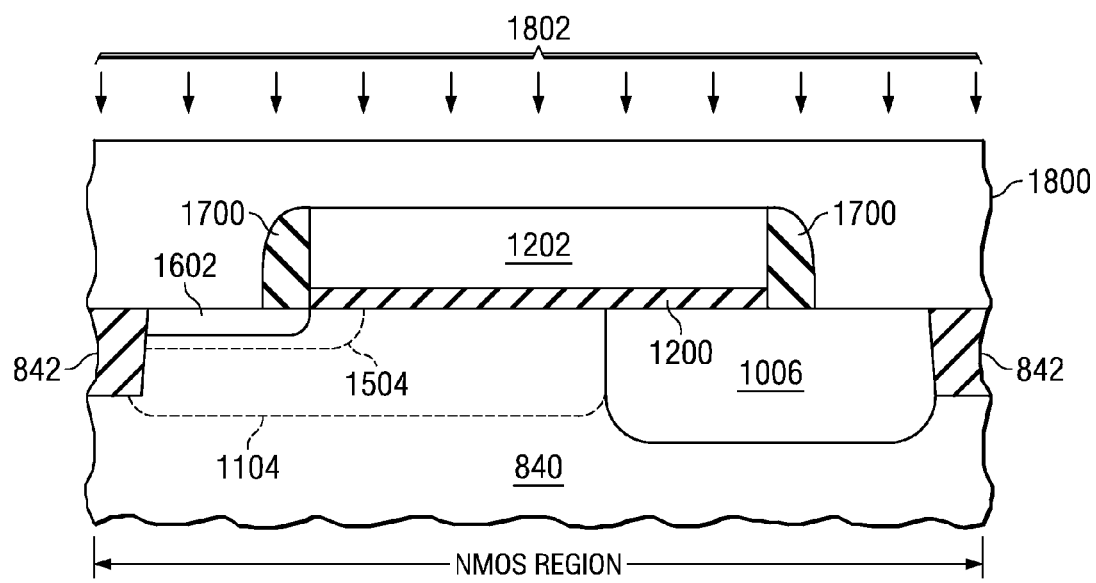

In FIGS. 20A-20C, a PMOS source/drain mask 1800 has been patterned to mask off the NMOS devices and leave the PMOS devices exposed. As FIGS. 20B-20C show, a p-type source/drain implant 1802 is performed to form the PMOS source 1804 and drain 1806.

Figure 21A:
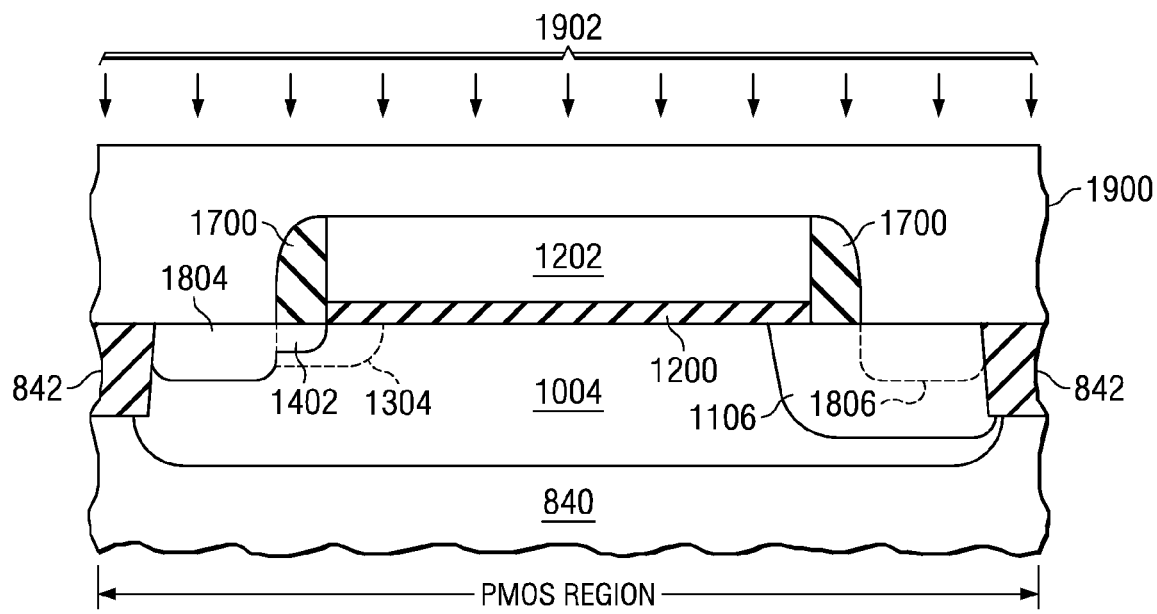
Figure 21B:
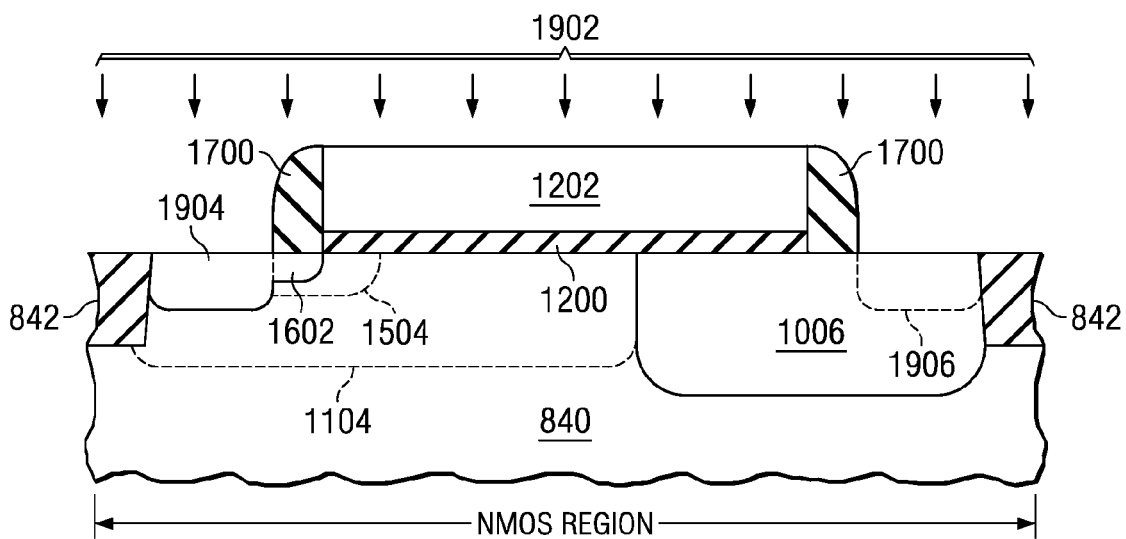

In FIGS. 21A-21B, the PMOS source/drain mask has been stripped and an NMOS source/drain mask 1900 has been patterned. This NMOS source/drain mask masks off the PMOS devices and leaves the NMOS devices exposed. As FIGS. 21A-21B show, an n-type source/drain implant 1902 is performed to form the NMOS source 1904 and drain 1906.

Referring now to FIGS. 22-25, one can see some graphs that show some performance characteristics of one embodiment of a symmetric drain extended device with an I-beam moat compared to those of a rectangular device. The graphs are in a standard format for matching studies and were performed using a thin gate oxide NMOS device in a 65 nm technology. In these graphs the horizontal axis is (1/$\sqrt{\text{TransistorActiveArea}}$), and the vertical axis is the standard deviation of the mismatch parameter of interest. Generally speaking, the "best" place to be on each graph is the point near the lower right-hand corner, where the area is small (compact layout) and the matching is tight (low sigma mismatch distribution).

The layout dimensions studied in FIGS. 22-25 were as follows. The rectangular devices had (W/L) values of (2/20), (1/10), (0.5, 5), and (0.2/2). By virtue of its large active area, the (W/L)=(2/20) rectangular device corresponds to the data point near the lower left-hand corner of each graph. The symmetric drain-extended I-beam devices were laid out with $W_2=W_3=2$ um, with varying ($W_1/L_1$) values of (1/10), (0.5/5), and (0.2/2). The ($W_1/L_1$)=(1/10) corresponds to the leftmost data point in the graphs since it has the largest active area of any of the I-beam devices.

Figure 22:
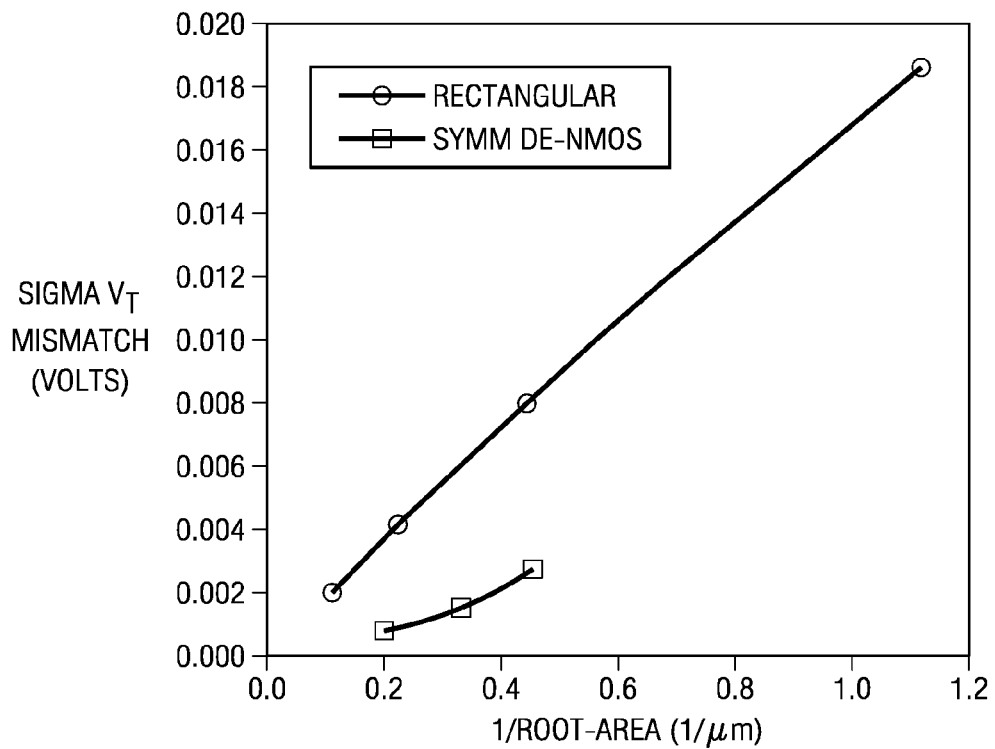
FIGS. 22-27 show graphical plots in accordance with aspects of one embodiment of the invention.
Figure 23:
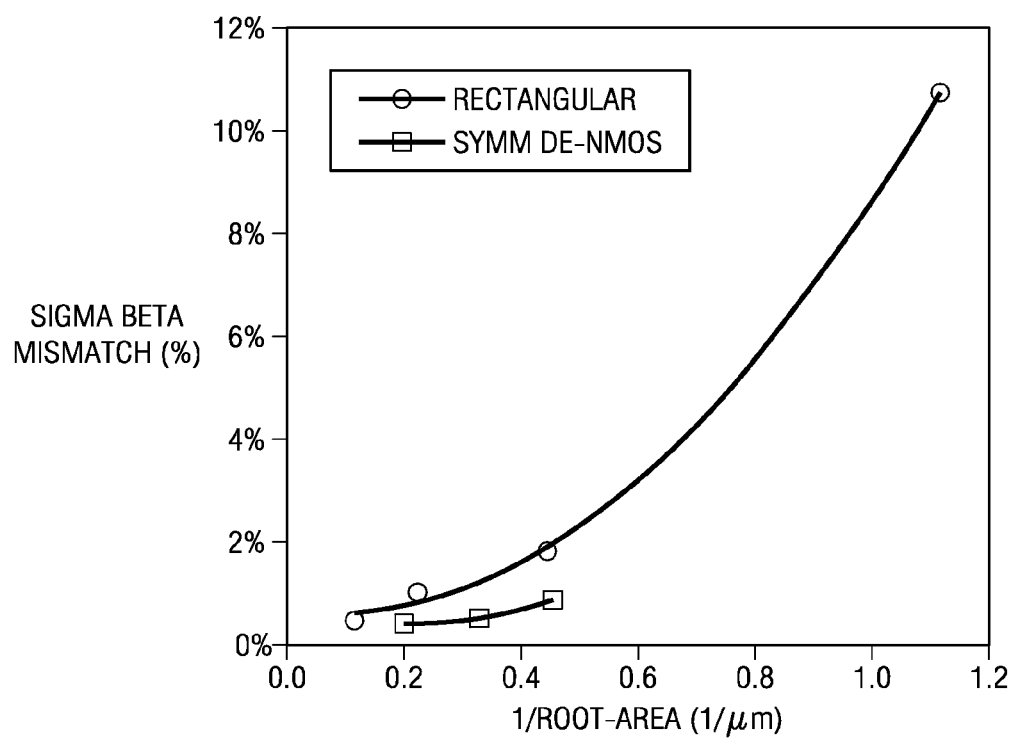
Figure 24:
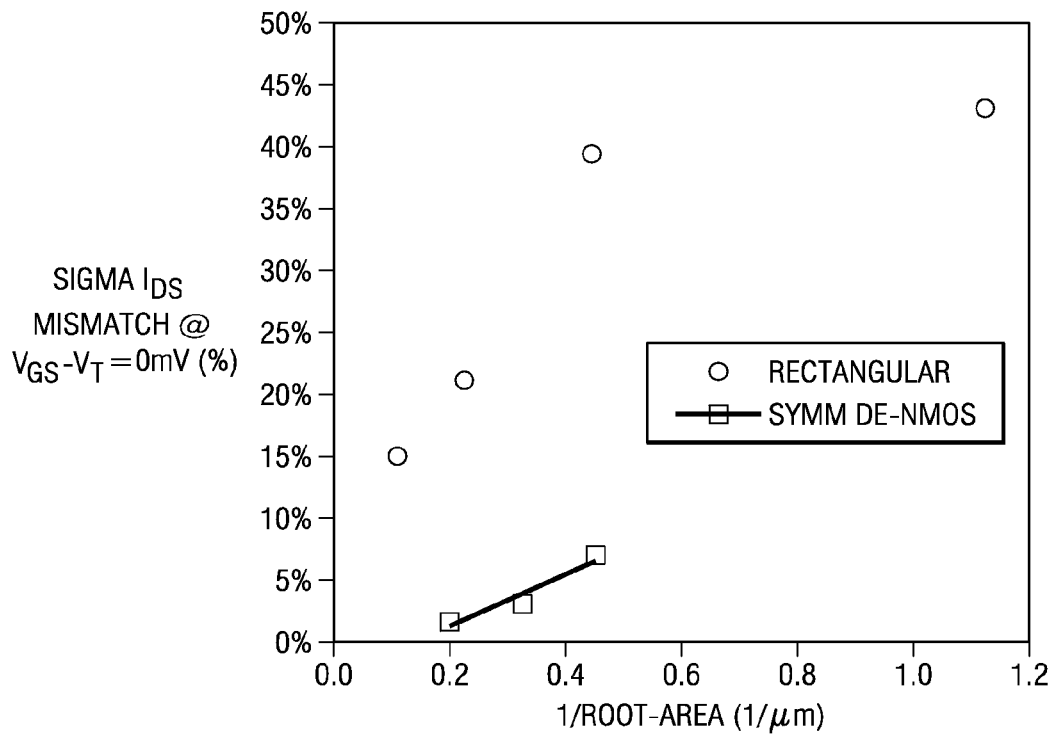
Figure 25:
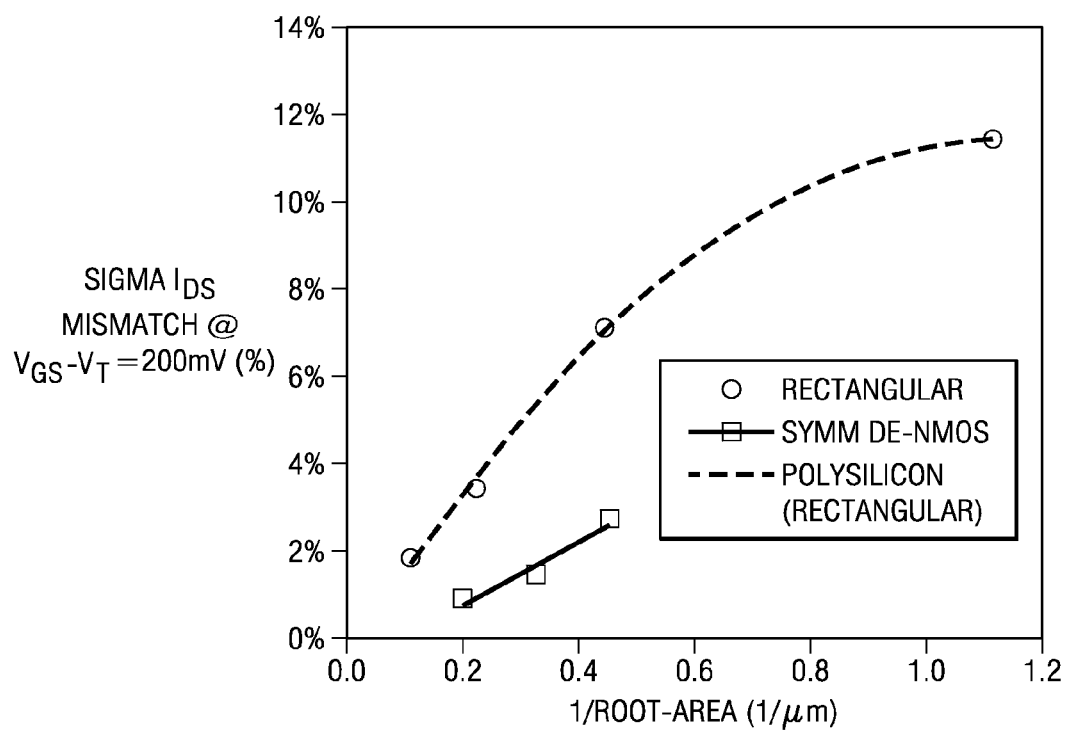

Four mismatch parameters were analyzed for each device style. More precisely, FIG. 20 shows the voltage threshold ($V_T$) mismatch; FIG. 21 shows the beta mismatch; FIG. 22 shows the current mismatch for sub-threshold inversion (where $V_{GS}$-$V_T$ is approximately equal to 0 mV); and FIG. 23 shows the current mismatch for strong inversion (where $V_{GS}$-$V_T$ is approximately equal to 200 mV). For all cases, $V_{DS}=V_{DD}$. As shown, the symmetric drain-extended I-beam devices have more compact layout than the (W/L)=(2/20) rectangular device, and they produce similar or better values of matching, thus showing that the matching of these long-channel devices is largely dominated by the pocket implant regions rather than the area of the bulk region.

Figure 26:
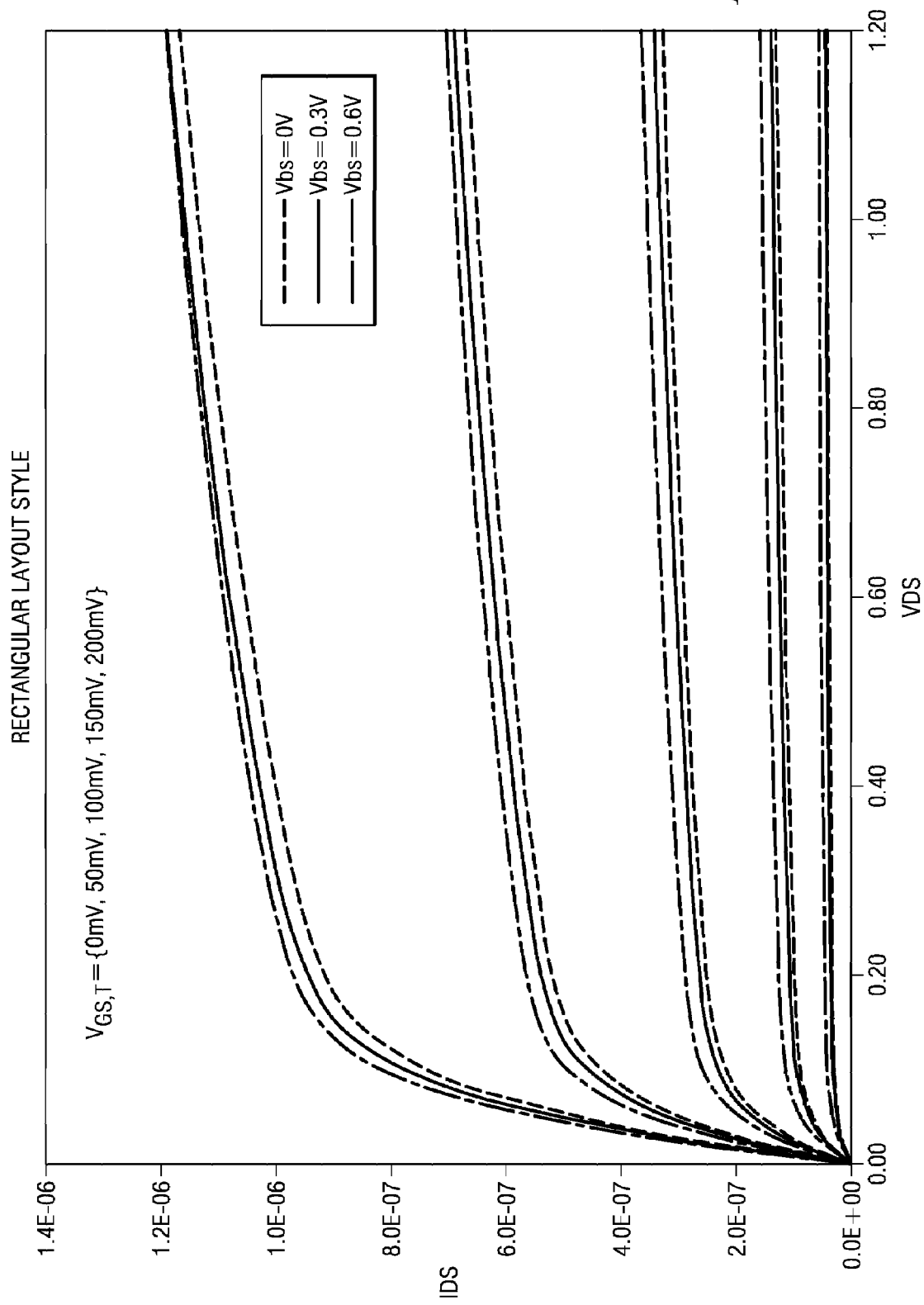
Figure 27:
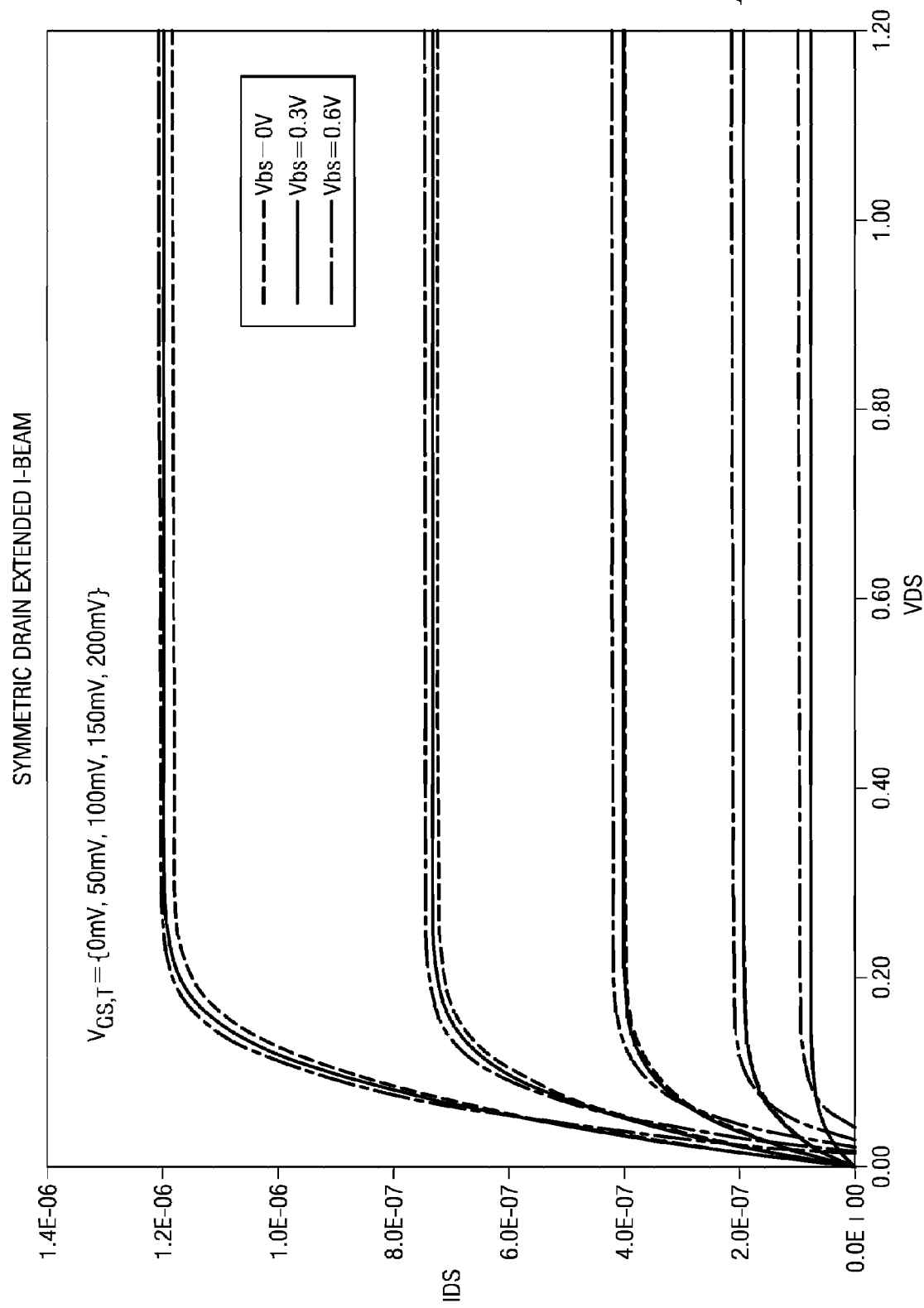

As can be seen from comparison of FIGS. 26 and 27, the differential output conductance is dramatically reduced by using the symmetric drain extended I-beam layout style, relative to the conventional rectangular layout style. Specifically, the plateau regions of the IDS (VDS) curves are extremely flat in FIG. 27, indicating that the symmetric drain extended I-beam layout style is capable of performing as an extremely stable (voltage-insensitive) current source. Having low output conductance in this sense is an extremely important transistor characteristic for analog circuits, underpinning such circuit-level characteristics as voltage gain, power supply rejection ratio, and common-mode rejection ratio.

Table 1 below shows a comparison of some features of several of the embodiments discussed herein. It will be appreciated that this table shows only general trends and that specific embodiments may not fall within the general trends shown in this table.

TABLE 1

Comparison of various embodiments.

|  | Rectangular | I-shaped | T-shaped |
|---|---|---|---|
| No extension wells ("CMOS") | Poor matching | Compact layout preserves matching | Compact layout preserves matching |
|  | Low $R_{out}$ | Low $R_{out}$ | Low $R_{out}$ |
| Extension well on only the drain ("Drain Extended CMOS") | Better matching than CMOS | Compact layout preserves matching | Compact layout preserves matching |
|  | High $R_{out}$ | High $R_{out}$ | High $R_{out}$ |
| Extension well on both source and drain side ("Symmetric Drain Extended CMOS" | Excellent matching | Compact layout preserves matching | Compact layout preserves matching |
|  | High $R_{out}$ | High $R_{out}$ | High $R_{out}$ |

Although matched transistors and methods for performing operations thereon have been illustrated and described, alterations and/or modifications may be made to these examples. For example, although some transistors have been shown as having an n-type bulk region, a p-type source, and a p-type drain (i.e., a PMOS device); in other embodiments the doping conventions could be reversed. For example, the bulk region could be p-type, and the source and drain could be n-type (i.e., an NMOS device). Alternatively, the present invention could be used with an NMOS device that is placed with a p-well or a shallow p-well as the body, such that the body is contained within a deep n-well, isolating the body from a p-type substrate.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit, comprising:
  a first matched transistor comprising: a first source region, a first drain region formed within a first drain well extension, and a first gate electrode having lateral edges about which the first source region and first drain region are laterally disposed;
  a second matched transistor comprising: a second source region, a second drain region formed within a second drain well extension, and a second gate electrode having lateral edges about which the second source region and second drain region are laterally disposed;
  analog circuitry associated with the first and second matched transistors, which analog circuitry utilizes a matching characteristic of the first and second matched transistors to facilitate analog functionality;
  wherein the first transistor has a T-shaped channel defining different channel widths under the first gate electrode in a separation region between the first source region and the first drain region.

2. The integrated circuit of claim 1, wherein the second transistor has a T-shaped channel defining different channel widths under the second gate electrode in a separation region between the second source region and the second drain region, and the different channel widths of the T-shaped channel of the second transistor are matched with the different channel widths of the T-shaped channel of the first transistor.

3. The integrated circuit of claim 2, wherein the first matched transistor further comprises a first source well extension in which the first source region is formed; and the second matched transistor further comprises a second source well extension in which the second source region is formed.

4. The integrated circuit of claim 2, wherein the first drain well extension has a continuous doping type under a first lateral edge of the first gate electrode, which first lateral edge is associated with the first drain well extension; and the second drain well extension has a continuous doping type under a second lateral edge of the second gate electrode, which second lateral edge is associated with the second drain well extension.

5. The integrated circuit of claim 2, wherein the analog circuitry comprises a current mirror.

6. The integrated circuit of claim 2, wherein the analog circuitry comprises an amplifier.

7. The integrated circuit of claim 2, wherein the first and second drain well extensions have the same doping type as the source and drain regions.

8. The integrated circuit of claim 7, wherein the first and second drain well extensions have a doping concentration that is lower than a doping concentration of the source and drain regions.

9. The integrated circuit of claim 2, wherein the first and second transistors are surrounded by an isolation structure that defines a first isolated region within which the first source region, first drain region and first drain well extension are formed, and a second isolated region within which the second source region, second drain region and second drain well extension are formed; the T-shaped channel and different channel widths of the first transistor being defined by different widths of the first isolated region, and the T-shaped channel and different channel widths of the second transistor being defined by matching different widths of the second isolated region.

10. The integrated circuit of claim 1, wherein the first transistor is surrounded by an isolation structure that defines an isolated region within which the first source region, first drain region and first drain well extension are formed; and the T-shaped channel and different channel widths are defined by different widths of the isolated region.

11. An integrated circuit including a first semiconductor device, comprising:
  source and drain regions formed about lateral edges of a gate electrode associated with the first device and separated from one another by a gate length;
  a drain well extension region situated about the drain region; and an isolation trench that defines a T-shaped channel region with different widths under the gate electrode in a separation region between the source and drain regions, which widths are approximately laterally perpendicular to the gate length.

12. The integrated circuit of claim 11, wherein different widths of the channel region follow at least one of the following three geometries: tapered, rounded, and fermi function.

13. The integrated circuit of claim 11, wherein the channel region includes a pocket implant region under a lateral side of the gate electrode opposite to the drain well extension region.

14. The integrated circuit of claim 13, wherein the channel region has a continuous doping type under a lateral side of the gate electrode associated with the drain well extension region.

15. The integrated circuit of claim 11, further comprising a source well extension region situated about the source region.

16. The integrated circuit of claim 11, wherein the channel region has a continuous doping type under lateral sides of the gate electrode.

17. The integrated circuit of claim 11, further comprising a second device that is geometrically matched to the first device.

18. The integrated circuit of claim 17, further comprising analog circuitry associated with the first and second devices, which analog circuitry utilizes a matching characteristic of the first and second devices to facilitate analog functionality.

19. The integrated circuit of claim 11, wherein the isolation trench surrounds an isolated region of a semiconductor body over which the first device is formed, which isolated region comprises a first set of opposing sidewalls separated by a first width under the gate electrode in the separation region between the source and drain regions, and a second set of opposing sidewalls separated by a second width under the gate electrode in the separation region between the source and drain regions, the second width being greater than the first width.

\* \* \* \* \*